United States Patent [19]
Avidan

[11] Patent Number: 5,740,347
[45] Date of Patent: Apr. 14, 1998

[54] CIRCUIT ANALYZER OF BLACK, GRAY AND TRANSPARENT ELEMENTS

[75] Inventor: Jacob Avidan, Los Altos, Calif.

[73] Assignee: Synopsys, Inc., Mountain View, Calif.

[21] Appl. No.: 429,430

[22] Filed: May 1, 1995

[51] Int. Cl.[6] ............................................. G06F 13/00
[52] U.S. Cl. .................... 395/183.09; 371/23; 364/578; 364/489
[58] Field of Search ..................... 395/183.09, 183.08, 395/183.05, 183.03; 364/578, 489; 371/23

[56] References Cited

U.S. PATENT DOCUMENTS

| | | | |
|---|---|---|---|
| 4,601,032 | 7/1986 | Robinson | 371/23 |
| 4,763,289 | 8/1988 | Barzilai et al. | 364/578 |
| 5,345,393 | 9/1994 | Ueda | 364/489 |
| 5,345,401 | 9/1994 | Tani | 364/578 |
| 5,404,360 | 4/1995 | Suzuki et al. | 371/23 |

Primary Examiner—Robert W. Beausoliel, Jr.
Assistant Examiner—Norman M. Wright
Attorney, Agent, or Firm—Townsend and Townsend and Crew LLP; Larry Mendenhall

[57] ABSTRACT

A method, apparatus and medium containing a computer program for analyzing timing in circuits. In one embodiment, the invention sets the direction of elements of a circuit by partitioning the circuit to identify a subcircuit including a pullup or pulldown block, then modeling the subcircuit as a single transistor, then setting the direction of that single transistor and then propagating the direction of that single transistor to other elements of the subcircuit. In another embodiment, the invention generates a gray box model by searching paths from a primary clock input of a circuit, determining worst and best paths among the multiple elements of the circuit and incorporating the best and worst path information in the gray box model. In another embodiment, the invention instantiates such a gray box model in a second circuit and performs timing checks on this second circuit.

27 Claims, 34 Drawing Sheets

SAVE PATH TO DB

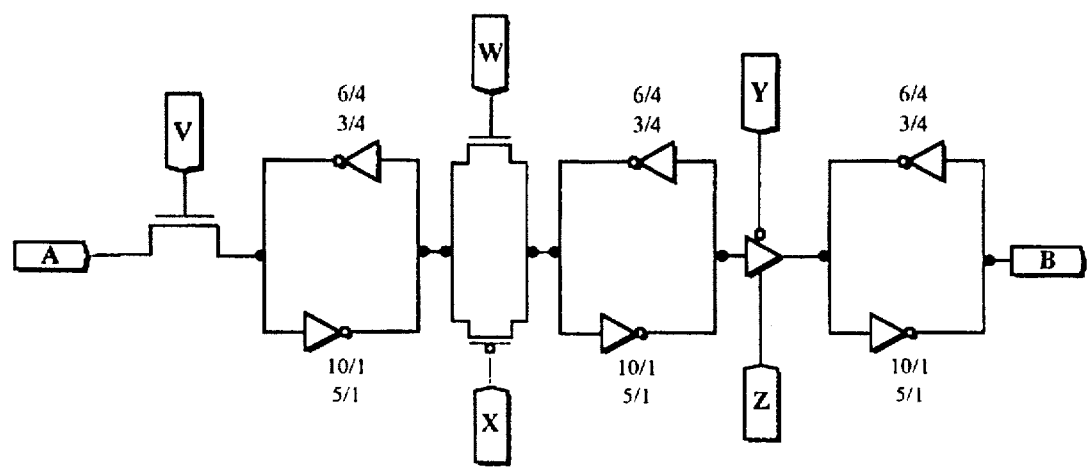
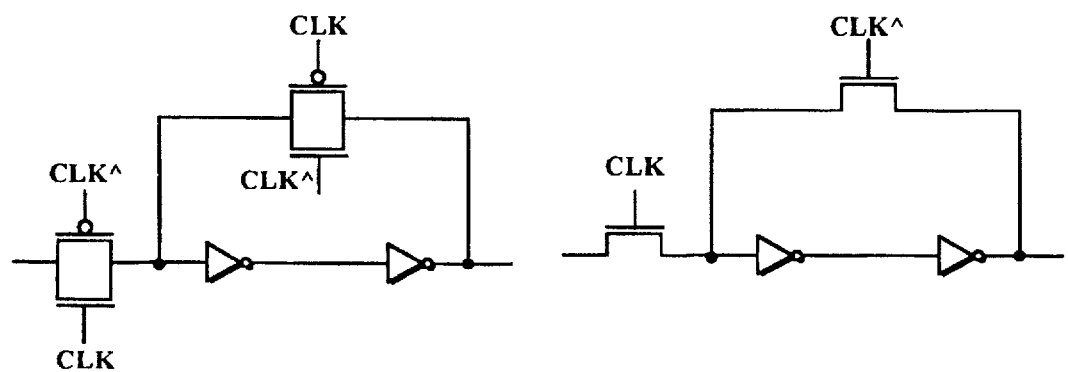
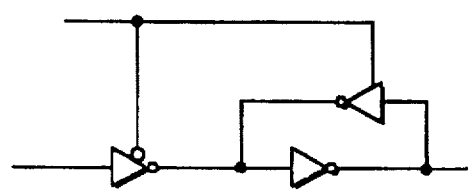
*FIG. 15*

MODEL (*model_name*)

specifies the name of the model to be instantiated

ENDMOD(0);     ends the model description.

The following is an example of a model template:

```
EXAMPLE
    MODEL(model_name)
    {
    /*  This section interfaces user's model with PathMill
        or TimeMill */
    /*  Declare input ports, output ports, internal states
        and biput ports */
    INPUTS
       /* Input ports defined here*/
    ENDD;
    OUTPUTS
       /* Output ports defined here */
    ENDD;
    BIPUTS
       /* Biput ports defined here */
    ENDD;
    STATES
       /* Internal states defined here */
    ENDD;
    /*  This section describes the functional/behavior
           model in "C" language by the user. */
    /*  The body of the model described here */
    ENDMOD (0);
    }
    /* End of model */
```

*FIG. 27*

```
MODEL(XYZ)
    {
INPUTS
      SIG(APP);
      SIG(BPP);
      SIG(clk);
      BUS(IN_bus,8);
ENDD;
OUTPUTS
      SIG(p);
      SIG(QQ);
      SIG(res);
ENDD;
STATES
      BUS(mem,3);
ENDD;
```

*FIG. 28*

```
/*-------------------------------------------------------------------------
|                    PATHMILL 3.1-sun 06-05-94                            |
|     Copyright (c) 1987-1994 EPIC Design Technology, Inc., All Rights Reserved. |
 -------------------------------------------------------------------------

Hierarchical Model, Done on Mon Jun  6 21:43:43 1994
*/
#define   FALL_FALL       2
#define   FALL_RISE       3
#define   RISE_FALL       4
#define   RISE_RISE       5
#define   RISE_T          6
#define   FALL_T          7
#define   FALL_FALL_T     8
#define   FALL_RISE_T     9
#define   RISE_FALL_T    10
#define   RISE_RISE_T    11
#define   LONGEST         0
#define   SHORTEST        1

MODEL(pm_model)
{
INPUTS
    SIG(A);
    SIG(B);
    SIG(CLK);
ENDD;

OUTPUTS
    SIG(X);
    SIG(Z);
ENDD;

IOtest (3, 2, pm_model);

fin_cap(    43,A);
    fin_cap(    43,B);
    fin_cap(    43,CLK);
    fout_cap(   51,X);
    fout_cap(   51,Z);

transparent_begin   {
        f_latch_delay(63.90, 63.90, ZL, R, Z, R, 116.30, 116.30);
        f_latch_delay(41.00, 41.00, ZL, F, Z, F, 208.04, 208.04);
        f_latch_delay(45.10, 45.10, A, R, ZL, F, 0.0, 0-0);
        f_clock_delay(31.40, 31.40, CLK, R, ZL, F, 50.60, 33.90, LOW, T);
        f_clock_delay(28.00, 28.00, CLK, F, ZL, R, 0.0, 0.0, LOW, T);
        f_latch_delay(49.00, 49.00, A, F, ZL, R, 0.0, 0-0);
    }
    transparent_else    {
        fsetup(17,A,CLK,RISE_FALL_T);
        fsetup(21,A,CLK,FALL_FALL_T);
        fhold(-17,A,CLK,RISE_FALL);
        fhold(-21,A,CLK,FALL_FALL);
    } fout_load_range(X,    50,  70);
    fout_load_range(Z,    20,  90);

if (fin_sig(CLK))    {
       fin_slope_range(CLK,10.00,80.00);
       if (CLK == ONE)   {
           fd_drup(126.00,Z,116.30,0,0.20,30.60,138.48);
           fd_drdn(86.40,Z,208.04,0,0.20,4.50,623.48);
       }
    }
    else
    if (fin_sig(B))   {
       fin_slope_range(B,10.00,80.00);
       if (B == ONE)
           fd_drup(27.20,Z,113.70,0,0.20,10.00,258.91);
       if (B == ZERO)
           fd_drdn(27.50,Z,209.57,0,0.20,1.30,650.00);
       if (B == ONE)
           fd_drup(24.70,X,112.69,0,0.20,7.30,250.00);
       if (B == ZERO)
           fd_drdn(20.00,X,128.85,0,0.20,5.00,304.23);
    }

ENDMOD(O);
}
```

*FIG. 29*

INPUT PIN CHARACTERIZATION

OUTPUT PIN CHARACTERIZATION

PRINT MODEL PINS

PRINT SETUP & HOLD

CIRCUIT ANALYZER OF BLACK, GRAY AND TRANSPARENT ELEMENTS

COPYRIGHT NOTICE

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND OF THE INVENTION

This invention relates to circuit analyzers. In particular, this invention relates to circuit analyzers performing static analysis of circuits including black box timing models.

Circuit analyzers in the art fall into one of two general categories: dynamic and static. With dynamic analyzers, the design or diagnostic engineer must provide sets of waveforms to simulate the conditions under which a circuit will operate. Of course, the more the sets reflect all possible operating conditions, the more accurate the result of the dynamic analysis can be. The cost, however, of producing exhaustive waveform sets can be extremely high.

Static analyzers, on the other hand, relieve the design engineer of the trouble of supplying comprehensive input vectors. A static analyzer can identify critical paths in a circuit, find timing errors and estimate overall performance. This waveform independence is particularly efficient and useful for large systems. Such static analyzers can identify critical paths which the test patterns do not exercise during timing simulation.

Abstracting a section of a circuit into a block timing model can be useful. Block models allow circuit analyzers to verify a large circuit at a chip level, with attendant savings in time to perform the analysis. A timing model can also serve as a communication tool between different groups of designers since the model provides a simple way to describe the operation of the circuit section and to check the interfaces between different design blocks. Each of the design groups will generate a timing model for its own block and will roll it up to full chip timing.

The most common block timing model that has been used for this purpose is the black box model. There are two types of paths in a black box: combinatorial or latched. A combinatorial path proceeds from an input pin of the black box to an output pin, passing through only combinatorial logic. A black box models combinatorial paths as pin-to-pin delays. Latched paths, however, are a convergence of data and clock inputs onward to an output pin. The black box models these latched paths using setup and hold times. A black box model can also include slope- and load-dependent delays with respect to the driving of an input or output pin.

In a black box model, the modeler derives setup and hold times for an input pin from the first or most critical (i.e., restrictive) latch in the latched path from that input pin. FIG. 1 shows a latch for which a modeler would derive setup and hold times. Latch 10 has data input 5 and clock input 6. Clock signal 4, with leading (opening) edge 1 and trailing (closing) edge slope 2, is a typical waveform for input on clock input 6. (Clock signal 4 is active HIGH.) The black box modeler can make the setup time a function of leading edge 1 of clock signal 4 or a function of trailing edge 2 of clock signal 4. In the former case, input on data input 5 must arrive at latch 10 before clock signal 4 goes active. In the latter case, the latch can sample data after leading edge 1 arrives at the latch.

The main disadvantage of black box modelling is that the modelling does not support latch transparency. FIG. 2 shows a sequence of black boxes which can illustrate the limitations of black box modelling. FIG. 2 shows a first black box model, block A, with an output signal n1 coupled as an input to a second black box model, block B. Block B itself has an output, signal n2, coupled as an input to the third black box model, block C. Assume that a data signal goes from block A to block C through latches internal to block B. If a circuit analyzer detects a setup time violation on signal n2, then the design engineer must involve block B in the effort to correct the violation. If, however, there is spare time on the input of block B, signal n1, the engineer might desire to borrow or transfer that spare time from signal n1 to signal n2. If this is possible, then the engineer need not change block B. With black box modelling, the designer will have to do this time borrowing manually and will have to generate a new model that reflects this time borrowing. Black box modelling does not permit a latch to sample data after the leading edge of the clocking signal.

Accordingly, it is an object of this invention to provide a solution for latch transparency in timing models.

In the design cycle of a circuit, clock waveforms very often change due to changes in the layout of the design. Such a change in a clock waveform may require the designers to re-verify large portions of the design.

Accordingly, it is another object of this invention to enable verification of a circuit without abandoning block-level modelling and without regenerating a timing model.

In order to check for internal violations of design parameters, a design engineer using black box block models would typically wait until each block was replaced with its device-level equivalent. Using device-level equivalents first requires that each group of designers complete its respective device-specific implementation of its block.

Accordingly a goal of this invention to permit the checking of paths internal to block models without descending to a device-level circuit.

These and other objects and goals of this invention will be readily apparent to those of skill in the art on reading the disclosure below.

SUMMARY OF THE INVENTION

Hereinbelow is disclosed a circuit analyzer of circuits containing black, gray and transparent elements. A black box models combinatorial paths as pin-to-pin delays and models sequential paths using setup and hold times. A gray box still represents combinatorial logic as a pin-to-pin delay but does not use setup and hold times for sequential elements. Instead, a gray box includes a representation of the sequential elements of the block. A gray box uses pin-to-pin delays to connect a primary input of the block to the first line of sequential elements, from one sequential element to another and from a sequential element to a primary output. The gray box block model also connects primary input clocks to the clock inputs of the sequential elements.

Gray box modeling provides a full solution for latch transparency in timing models. Because the present invention can analyze data that crosses from one block to another automatically, its gray box modeling figures out that time borrowing can be done and will not flag design violations. This automatic time borrowing reduces the length of the design cycle. Without gray box modeling, the detection of a design violation may require tremendous effort on the part of the design engineers to trace and solve the problem.

Because gray box modeling does not assume any clock waveform, a design engineer can use a gray box to verify a circuit design under a new clocking scheme at the block level. The design engineer need not convert to a device-level model or regenerate a timing model. The engineers can use a gray box block model not only when the clock waveform changes but also when the clock itself changes or when different clocks are necessary for different instances of the gray box block.

Gray box modeling offers the ability to verify every path in a design, not only paths on the interface but also paths internal to the gray box. Therefore, a design engineer can use gray box modeling to detect internal violations in every stage of the design, ensuring that some design changes do not cause an internal violation. This ability can save time compared to the traditional use of a device-level model of an entire design.

BRIEF DESCRIPTION OF THE DRAWINGS

FIG. 15 shows some latches which the present invention recognizes.

FIG. 27 shows the template for gray box model data in a preferred embodiment.

FIG. 28 shows an example declaration section for a gray box model according to a preferred embodiment.

FIG. 29 shows an example gray box model according to a preferred embodiment, for a particular circuit.

FIG. 31 more fully illustrates the initialization of a timing model data structure.

FIG. 32 more fully illustrates the characterization of an input pin.

FIG. 33 more fully illustrates the characterization of an output pin.

FIG. 34 illustrates more fully the saving of the timing model.

FIG. 35 illustrates more fully the saving of path information in the data structure of the gray box block model.

FIG. 37 illustrates more fully the printing of model pins.

FIG. 38 illustrates more fully the printing of the model loads.

FIG. 39 illustrates more fully the printing of pin-to-pin delays.

FIG. 40 illustrates more fully the printing of setup and hold times.

FIG. 41 illustrates more fully the printing of gray box model data.

DESCRIPTION OF THE PREFERRED EMBODIMENT

Definitions clocked transistor: a transistor whose gate node is controlled by a clock. Such a transistor is also referred to as a clocked pass transistor.

clocked pass transistor: a transistor whose gate node is controlled by a clock. Such a transistor is also referred to as a clocked transistor.

clock-induced sink node: the output node of a stage which contains a clocked pass transistor. This node is also referred to as a latch node.

clock node: a node marked as a clock either by the user or by clock propagation according to the invention.

control node: a node that is set to a fixed logic state by the user. However, the present invention predefines Vdd and Gnd as control nodes.

data node: a node that is not a clock or control node.

gated clock: a stage with a data or control node as input and a clock node as output.

latch node: the output node of a stage which contains a clocked pass transistor. This node is also referred to as a clock-induced sink node.

node: a point of connectivity, including an input or output of the circuit.

reference clock node: a clocked node (local or global) which is used as reference for timing checks.

sink node: a node which terminates a path. A sink node is typically an output node of a circuit.

source node: a node at the beginning of a path. A source node is typically an input of a circuit.

stage: a combinatorial and/or sequential element, with at least one input and one output.

trigger node: a node which causes analysis of a stage.

Figure 7:
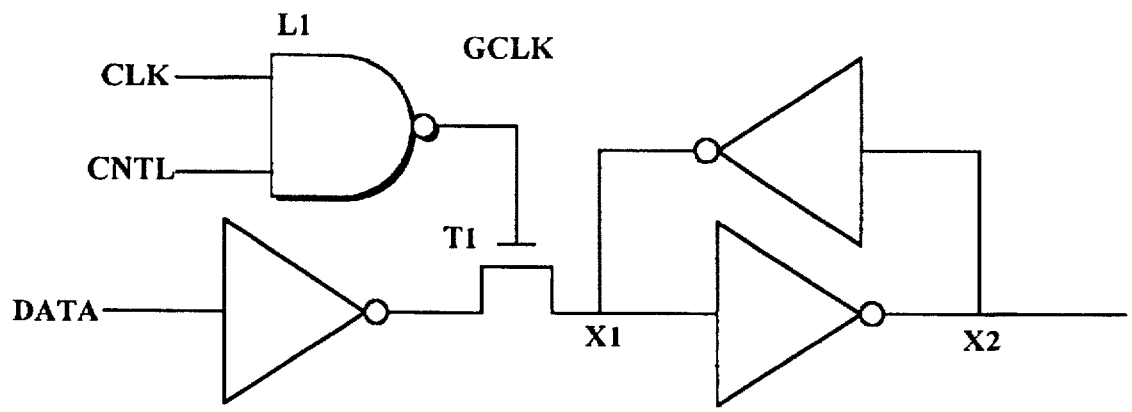
FIG. 7 is a schematic useful for illustrating definitions.

FIG. 7 is a schematic useful for illustrating some of the above definitions. In FIG. 7, CLK and GCLK are clock nodes, CNTL is a control node, and DATA is a data node. X1 is a latch node, T1 is a clocked transistor, and L1 is a gated clock.

Overview

Central to the circuit analyzer of the present invention is a path search algorithm which can trace every path in a given circuit, preferably in a depth-first manner. Because the number of paths can be prohibitive, computationally or time-wise, the user typically specifies the source nodes from which to initiate a path search. While tracing each path, the present invention accumulates the delay times along the path. It uses the reporting criteria which the user specifies to sort the paths. The present invention then prints out reports (including SPICE decks, preferably) in output files.

When searching, the present invention looks at a path of a circuit as a collection of trigger nodes and stages. A path starts at a user-defined source node, continues through a series of stages and trigger nodes and ends at a sink node.

Figure 5:
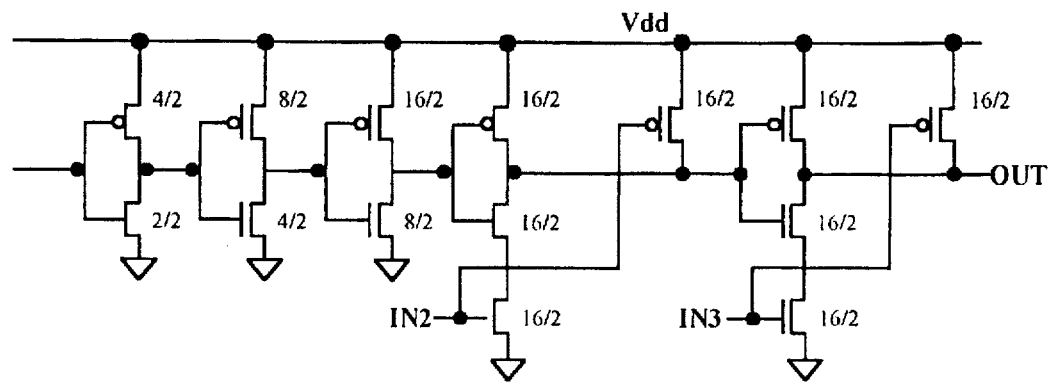
FIG. 5 shows a typical CMOS digital circuit according to the prior art.

Most CMOS digital circuits are based on pull-up and pull-down logic, as shown in FIG. 5. The delay for pull-up/ pull-down logic is directly proportional to the series resistance of the transistors between the output of the logic and the path to supply or ground. The present invention exploits this characteristic by breaking the circuit into stages of channel-connected transistors. These stages are recognized dynamically as the path search progresses.

A node which causes the present invention to analyze a stage is a trigger node. A source node is the first trigger node. The present invention creates different stages for the rise and fall of signals on paths.

Delay Calculation

Figure 6:
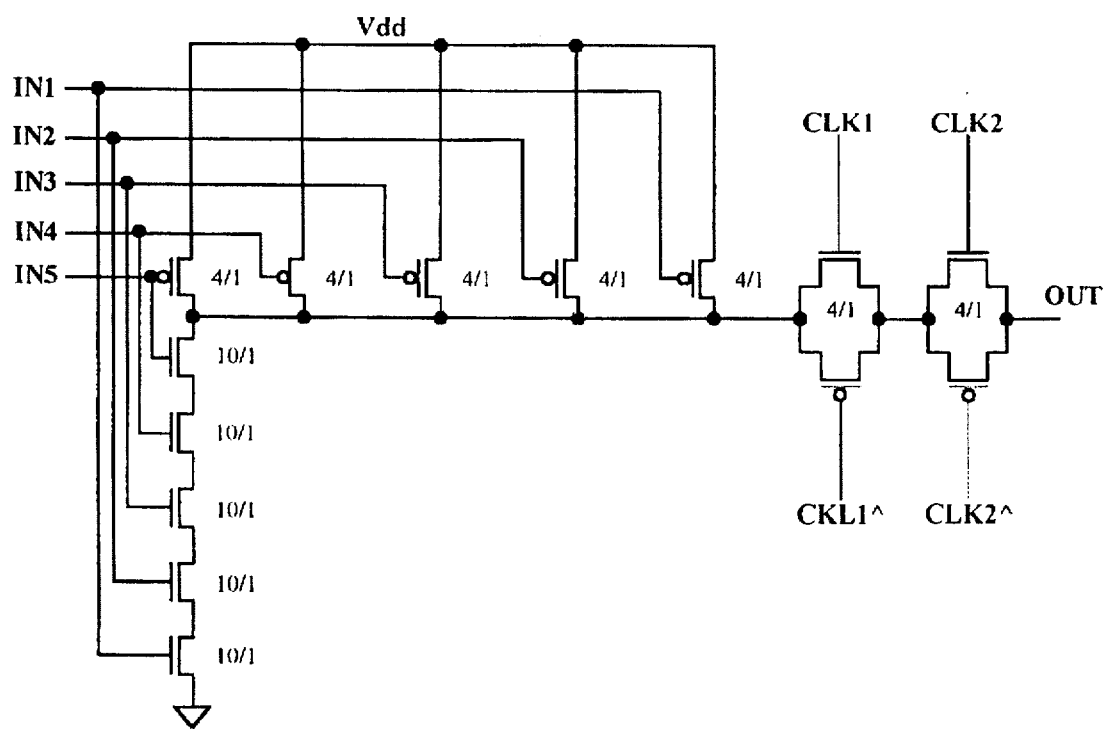
FIG. 6 shows a 5-input NAND gate of the prior art.

The present invention calculates the delay for each stage in a path, and the total delay of the path is the sum of the delays for all the stages along the path. FIG. 5 shows a series of inverters and 2-input NAND gates. Here the longest pull-up stage contains only one P-transistor while the longest pulldown stage has two N-transistors, for example, IN3 to OUT. In FIG. 6, a 5-input NAND drives two transfer gates. The longest pull-up stage contains five transistors, for example, IN5 to OUT. The longest pull-down stage contains nine transistors, for example, IN1 to OUT.

The present invention calculates the delay for each stage by running a transient analysis on the stage, with transistors being modeled by the EPIC Piecewise Linear Model available from the assignee of this patent application.

The present invention calculates a delay from the trigger node to each output of the stage. When there are multiple paths from the trigger node to a stage output, the present invention uses the longest or shortest delay.

Clock Analysis

With the present invention, the user specifies which nodes are primary circuit clocks. Derived clocks are the result of propagation of primary clocks through the circuit. The present invention propagates clocks based on several rules which are as follows:

Rule 1: Clocks are propagated through inverters.

Rule 2: Clocks are propagated through the source or drain of a transistor if the transistor is on. A transistor will only be on if its gate is a control node whose logic value is HIGH for N transistors and LOW for P transistors. Clocks are also propagated through static logic if all control inputs are on.

Rule 3: If the user specifies that clocks should be propagated through any static logic gate, regardless of the logic state on the input nodes of the gate, the present invention propagates clocks through pass gates (source or drain) and static logic gates without requiring logic states to be set for the non-clocked inputs. The user preferably uses a depth argument which specifies the number of levels of static logic gates through which the present invention is to continue the clock propagation. Clocks derived by the previous rules do not contribute to the depth.

Figure 8:
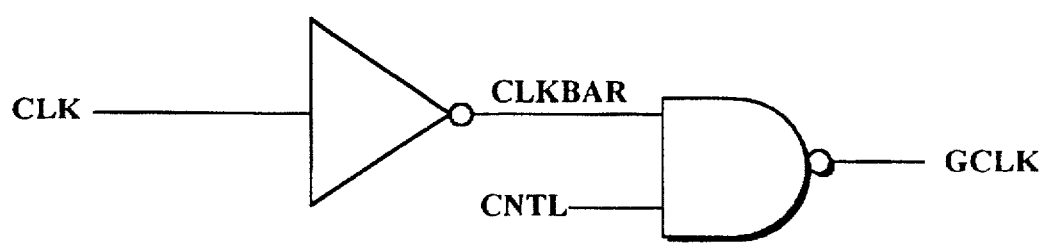
FIG. 8 is a schematic useful for illustrating clock propagation.

FIG. 8 is a schematic useful for illustrating clock propagation. In FIG. 8, the present invention sets CLKBAR to a clock because of the inverter. GCLK is set to a clock only if the user specifies that CNTL is a control node with a HIGH logic value or that clocks should be propagated through any static logic gate, regardless of the logic state on the input nodes of the gate.

The path searching of the present invention is independent of any clocking scheme. The only assumption for path searching is that a path stops at the far side of a clocked pass transistor (a latch node). To override the assumption, the user can instruct the present invention to check for transparent latches when performing timing checks, as described more fully below.

The present invention uses the user-defined clock definitions to perform the path searching from source nodes to latch nodes, from clock nodes to latch nodes, from clock nodes to sink nodes and from source nodes to gated clocks.

Starting a path search from a source node, the present invention stops the search when it reaches a latch node and reports a setup time. The setup time is the delay from the source node to the latch node less the delay from the clock to the gate of the clocked transistor. With the circuit of FIG. 7 as input, the present invention reports a path from node DATA to node X1. The setup time is the delay from DATA to X1 less the delay from CLK to GCLK.

If the user desires a more conservative setup time, he can direct the present invention to determine the setup time using the delay to the output of the latch node, X2. (If the user has a special latch type not recognized by the present invention, the user can force recognition of the latch as described below.)

When searching paths, the present invention also starts searching from clock nodes if the user specifies them as source nodes. The present invention stops a path search from a clocked source node when it reaches a latch node via the source or drain of a transistor. The total delay for the path includes the delay for the clock to reach the input latch plus the latch-to-latch delay to the next latch. The present invention reports both a latch-to-latch delay and an edge-to-edge requirement.

Figure 9:
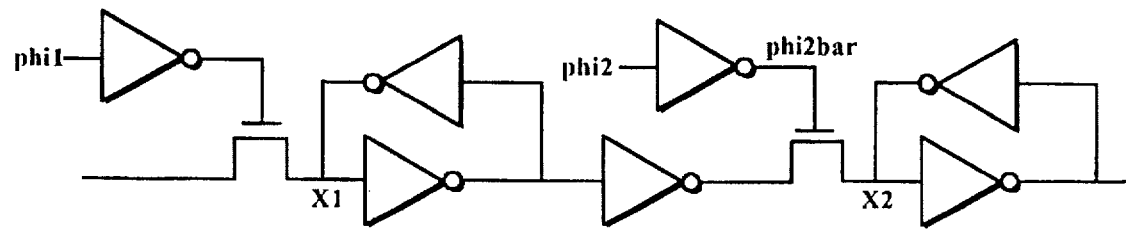
FIG. 9 is a circuit schematic useful for illustrating the determination of latch-to-latch and edge-to-edge delays.

The present invention determines the latch-to-latch delay as the delay for the complete path less the delay for the source clock to reach the first clocked transistor. The present invention determines the edge-to-edge delay as the delay for the complete path less the delay from the clock node to the gate of the clocked transistor controlling the second latch. FIG. 9 is a circuit schematic useful for illustrating the determination of latch-to-latch and edge-to-edge delays. In FIG. 9, the present invention reports a path from node phi1 through node x1 to node x2. The latch-to-latch delay refers to the delay from node x1 to node x2. The edge-to-edge delay refers to the delay from phi1 to x2 less the delay from phi2 to phi2bar.

Figure 10:
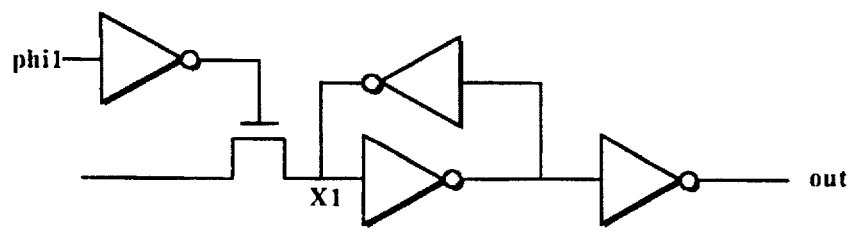
FIG. 10 is a circuit schematic useful for illustrating the determination of clock node-to-sink node delays.

The present invention also reports paths from clock nodes to user-specified sink nodes. The total delay for such a path includes the delay for the clock to reach the latch plus the latch to sink node delay. FIG. 10 is a circuit schematic useful for illustrating the determination of clock node-to-sink node delays. In FIG. 10, the invention reports a path from node phi1 through node x1 to sink node out.

Figure 11:
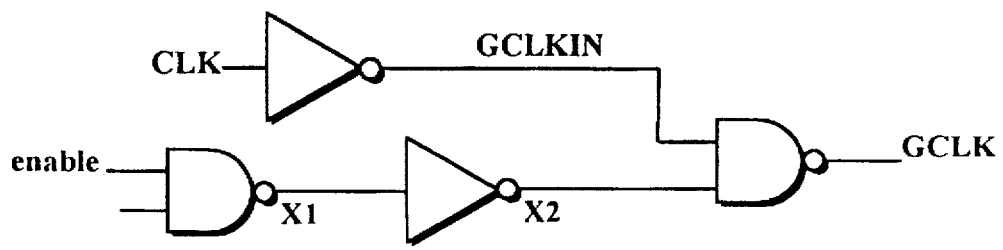
FIG. 11 is a circuit schematic useful for illustrating the determination of source node-to-gated clock delays.

The present invention stops a path search from a source node when it reaches a gated clock. Therefore, the delay for the path is the delay from the source node up to the input of the gated clock. The present invention reports a setup time which is the delay from the source node to the gated clock less the delay from the clock to the gated clock. FIG. 11 is a circuit schematic useful for illustrating the determination of source node-to-gated clock delays. With the circuit of FIG. 11 as input, the present invention reports a path from node enable through node X1 to node X2. The setup time refers to the delay from node enable to node X2 less the delay from CLK to GCLKIN.

For each clock node in the circuit, the present invention estimates and reports the maximum clock frequency using the maximum latch-to-latch delays. The clock frequency is determined for a single clock if there is a maximum latch-to-latch delay for both a HIGH transition of the clock and a LOW transition. The present invention determines the clock frequency of the single clock as the inverse of the sum of the maximum latch-to-latch delay with the clock rising and the maximum latch-to-latch delay with the clock falling. The clock frequency is determined for a pair of clocks if there is a latch-to-latch delay from the first clock to the second and from the second to the first. With a pair of clocks, the frequency is determined as the inverse of the maximum of the latch-to-latch delay from the first clock to the second added to the maximum latch-to-latch delay of the second clock to the first.

Gate Recognition

The present invention can recognize special gate configurations. This enables the present invention to produce more accurate delays and to search paths more efficiently. The present invention automatically recognizes the following types of logic gates: CMOS transfer gates, static RAM cells, latches, precharge logic (domino logic), feedback transistors and weak pullups.

Figure 12:
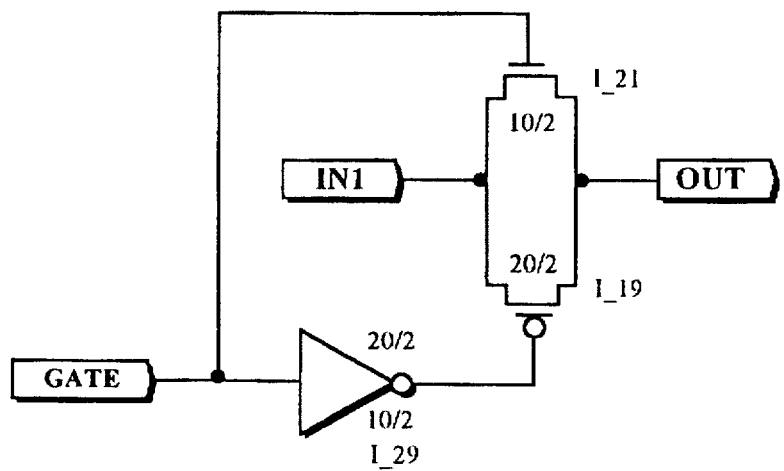
FIG. 12 illustrates a CMOS transfer gate which the present invention can recognize.

The present invention recognizes a CMOS transfer gate as P and N transistors connected with common source and drain nodes while the gate signals are logical inverses. FIG. 12 illustrates a CMOS transfer gate which the present invention can recognize. The present invention uses the transfer gate configurations in generating SPICE netlists for the critical path and to improve its delay calculation accuracy.

Figure 13:
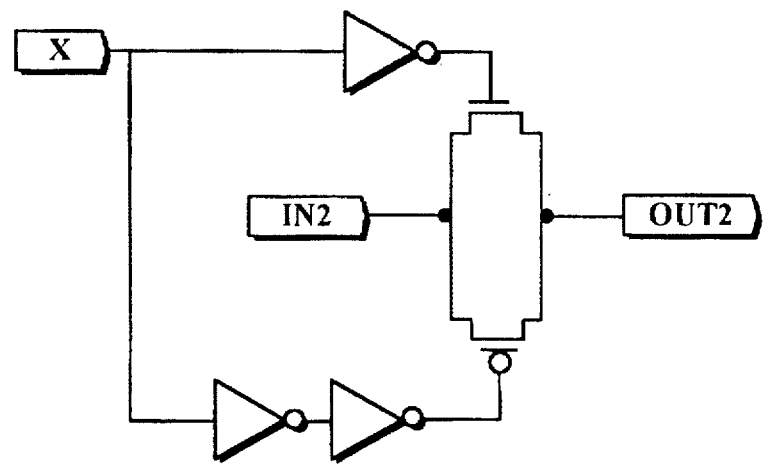
FIG. 13 shows another example of a CMOS transfer gate which the present invention recognizes.

FIG. 13 shows another example of a CMOS transfer gate which the present invention recognizes. In a preferred embodiment, the number of inverters connected to CMOS transfer gates which are searched is limited to 100. A significant improvement in performance can result. The user can change this default. The present invention also recognizes CMOS transfer gates which are connected to Vdd or Gnd.

In a preferred embodiment, the user can specify that all N and P transistor pairs are to be considered as transfer gates, even if the present invention cannot determine from the circuit that the gate connections are logical inverses.

Figure 14:
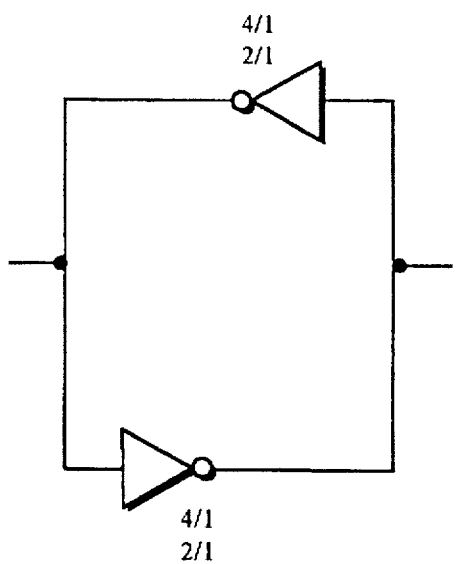
FIG. 14 shows a schematic of a static RAM cell.

The present invention recognizes and reports a RAM cell, an inverter connected to a feedback inverter with the same strength. The present invention stops path searching whenever it reaches a RAM cell. The user can, however, instruct the path searching algorithm to continue path searches through RAM cells. FIG. 14 shows a schematic of a static RAM cell.

The present invention recognizes and reports a latch, an inverter connected to a weaker feedback inverter. The present invention uses latch recognition to eliminate paths originating from the feedback paths of a latch. However, latch recognition is not necessary for proper operation of timing clocks. FIG. 15 shows some latches which the present invention recognizes. For latch types not automatically recognized directly by the present invention, the user can mark the latch node, the latch output and the transistors making up the feedback element and force recognition of the latch. The user can direct the invention to recognize latches with tri-state feedback, latches which the present invention does not recognize by default.

Figure 16:
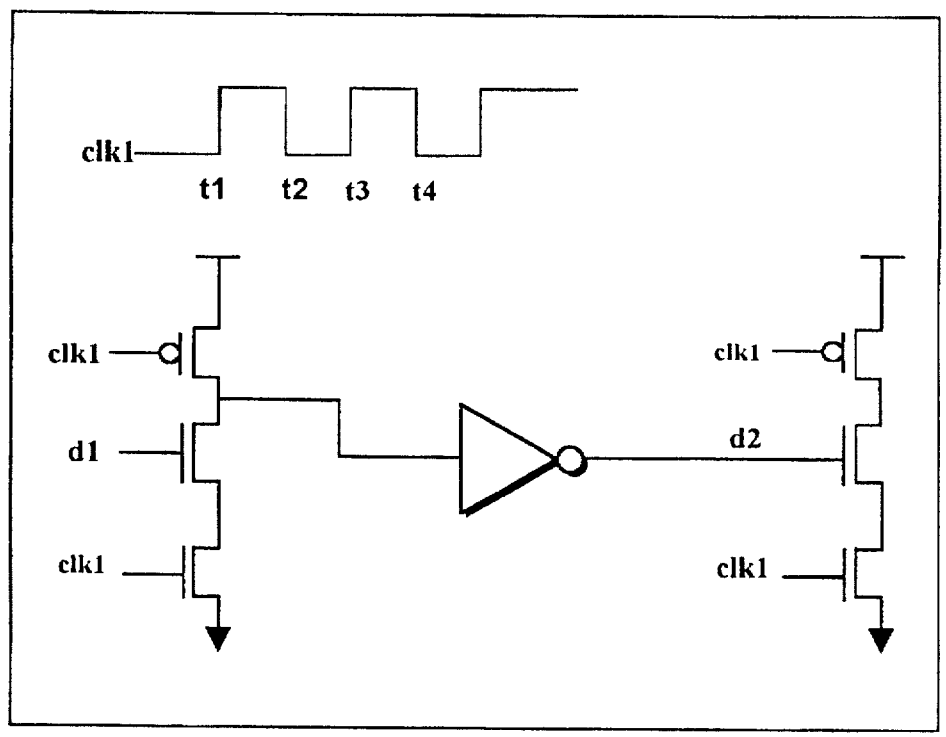
FIG. 16 shows a circuit schematic with domino logic and a controlling clock waveform.

The present invention automatically identifies precharge logic by a single PMOS pullup driving the node, which is controlled by a clock and a non-complementary logic stage. There is a timing check type for pre-charge logic input. HIGH-to-LOW input data should arrive before the leading edge of the evaluating clock. The present invention reports the path and the slack up to the pre-charge cell input. The evaluating clock is derived from the pulldown logic. If there is no such clock, then the precharge clock is used. This timing check is in addition to the domino support, in which the present invention recognizes a domino stage and treats it as a latch, so all the timing transparency checks are provided for domino logic. FIG. 16 shows a circuit schematic with domino logic and controlling clock waveform clk1.

Figure 17:
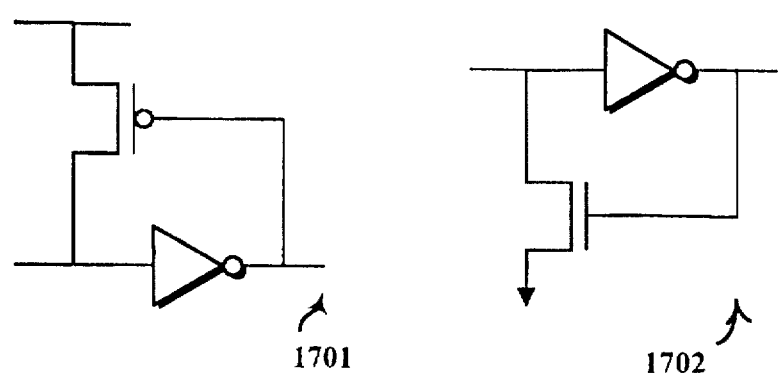
FIG. 17 is a schematic of two feedback transistor configurations.

FIG. 17 is a schematic of two feedback transistor configurations. The present invention recognizes feedback transistor configurations 1701 and 1702 and eliminates them from the path search.

Figure 18:
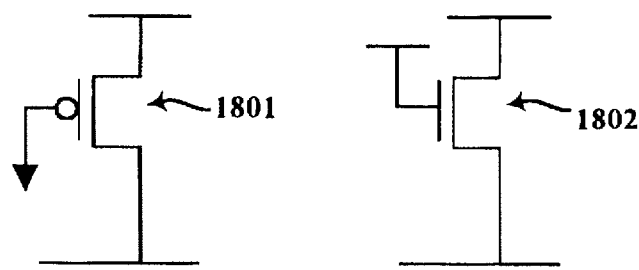
FIG. 18 is a schematic of the two transistor configurations which are candidates for weak pullup scenarios.

The present invention will treat as weak pullups transistors whose effective resistance is not less than a user-specified threshold or whose width, length or width-to-length ratio is not greater than user-specified thresholds. The transistor must be on by virtue of connection to a power supply. FIG. 18 is a schematic of the two transistor configurations which are candidates for weak pullup scenarios. If transistor 1801 or 1802 is not marked as a pullup transistor or if the output node is not marked as a weak pullup node, the present invention will set the output node to HIGH and no paths will be searched through this node.

Transistor Direction Setting

The present invention assumes all transistors to be bidirectional unless the user specifies a direction (e.g., in a netlist) or the present invention assigns a direction based on its direction-setting rules. The direction-setting rules are as follows:

Rule 1: Any transistor whose source is connected to Vdd or Gnd will have its direction set to source-to-drain. Any transistor whose drain is connected to Vdd or Gnd will have its direction set to drain-to-source.

Rule 2: Any pass transistor with its source connected only to the output of an inverter will have its direction set to source-to-drain. Any pass transistor with its drain connected only to the output of an inverter will have its direction set to drain-to-source. (Preferably, the user can direct the relaxation of this rule so that the rule can be applied even in the presence of fanout.)

Rule 3: If all but one of the transistors connected to an internal node have directions set such that the signal flows in a common direction then the direction of the unset transistor is set as follows: If the signal flow is into the node and the node is connected to the source of the unset transistor then the direction is set as source-to-drain. If the signal flow is into the node and the node is connected to the drain of the unset transistor then the direction is set as drain-to-source. If the signal flow is away from the node and the node is connected to the source of the unset transistor then the direction is set as or drain-to-source. If the signal flow is away from the node and the node is connected to the drain of the unset transistor then the direction is set as or source-to-drain.

Rule 4: This is the same as Rule 3 except there are two transistors with no direction. In this case Rule 3 applies if the gate signals of the two unset transistors are complements of each other.

Rule 5: This is also the same as Rule 3 except there is more than one unset transistor. In this case all the unset transistors must share the same source and drain nodes.

Rule 6: If an internal node has only source or drain connections to other transistors and one of these transistors has no direction and if the signal flow is in a common direction and only a path to Vdd or only a path to Gnd exists for this node then the direction of this transistor can be set as follows: If the signal flow is into the node and the node is connected to the source of the unset transistor then the direction is set as source-to-drain. If the signal flow is into the node and the node is connected to the drain of the unset transistor then the direction is set as drain-to-source. If the signal flow is away from the node and the node is connected to the source of the unset then the direction is set as drain-to-source. If the signal flow is away from the node and the node is connected to the drain of the unset then the direction is set as source-to-drain.

Signal Flow Direction Setting

The user may direct the present invention to use a signal flow direction setting algorithm which is an enhanced rules-based approach. In this improved method, the present invention first attempts to partition the circuit by identifying blocks which consist of one pulldown or one pullup block. The circuit-partitioning algorithm recursively analyzes and expands the structure of the block, assigning directions to MOS transistor and resistor elements in the block with each loop. The direction assignment only occurs if the element is serial/parallel-reducible, that is, if the element is-connected in series or parallel. This method provides direction assignments for all elements in a serial/parallel-reducible block. An example would be an AND-NOR-type complex gate.

Figure 26A:
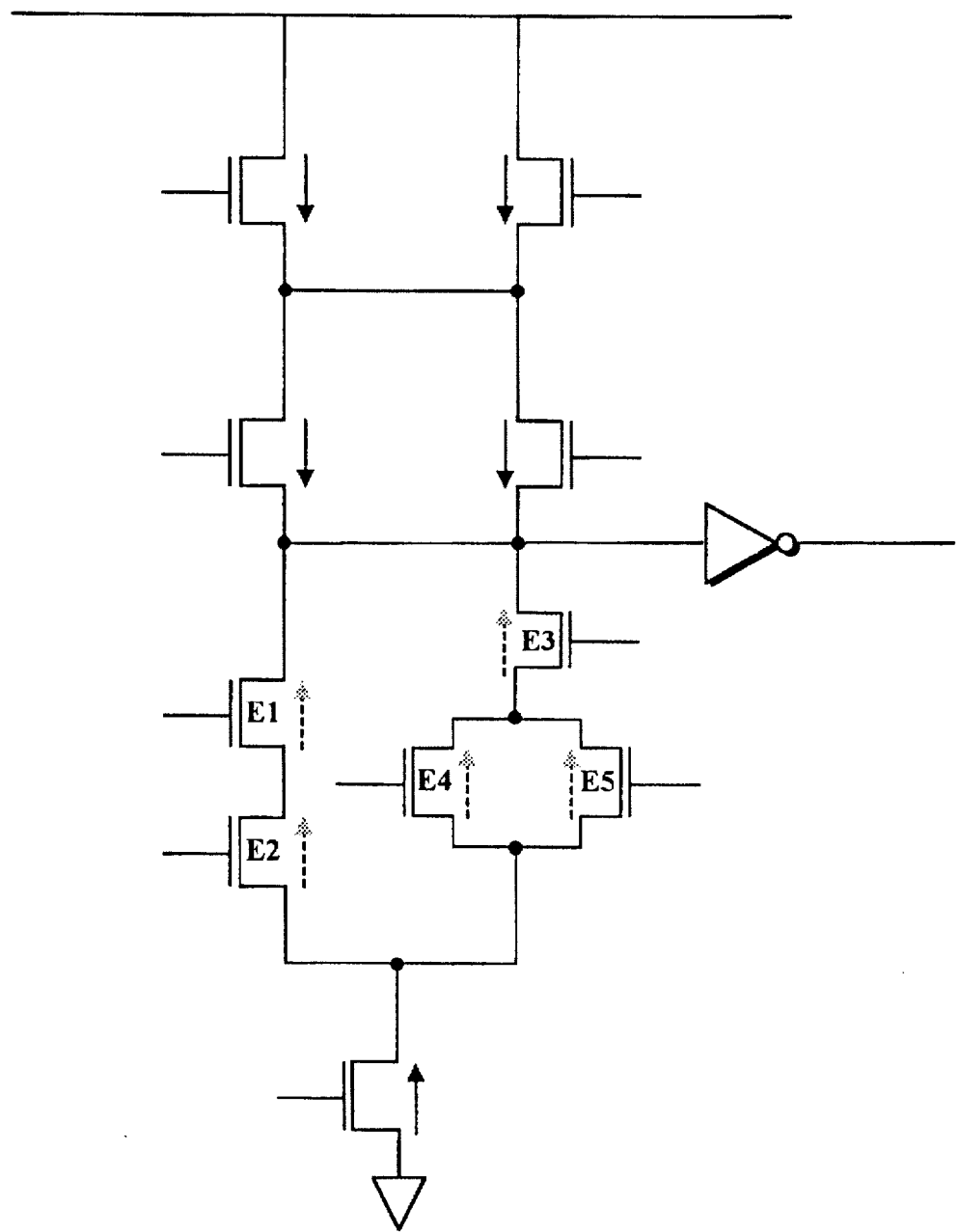
FIGS. 26A, 26B and 26C are schematics useful for illustrating signal flow direction setting according to the present invention.

The information which the present invention obtains during circuit partitioning resolves many direction-setting problems which can defeat a rules-based-only approach. With the AND-OR pulldown network illustrated in FIG. 26A, many rule-based algorithms will not set the transistor directions E1 through E5. The direction-setting algorithm of the present invention, however, first reduces all transistors from the pulldown network to a single transistor and sets the direction for the single transistor. Then, the algorithm propagates the direction to all reduced transistors.

For elements in a functional block which are not serial- or parallel-reducible and are not grouped to a functional block, heuristic rules are used to set the directions. Since these rules use structural information which the present invention obtains from circuit partitioning, the present invention can set more directions than many rule-based-only methods.

The heuristic rules are as follows:

Rule 1: Any transistor whose source is connected to Vdd or Gnd will have its direction set to source-to-drain.

Rule 2: If an element is not part of a memory latch structure and its source is connected to the output of a functional block or the output pin of a functional model which the present invention has partitioned, then the present invention sets the direction of the element to source-to-drain.

A similar rule applies to a drain terminal of an element.

Rule 3: All parallel elements, i.e., elements with common source and drain nodes) have the same direction.

Figure 26B:
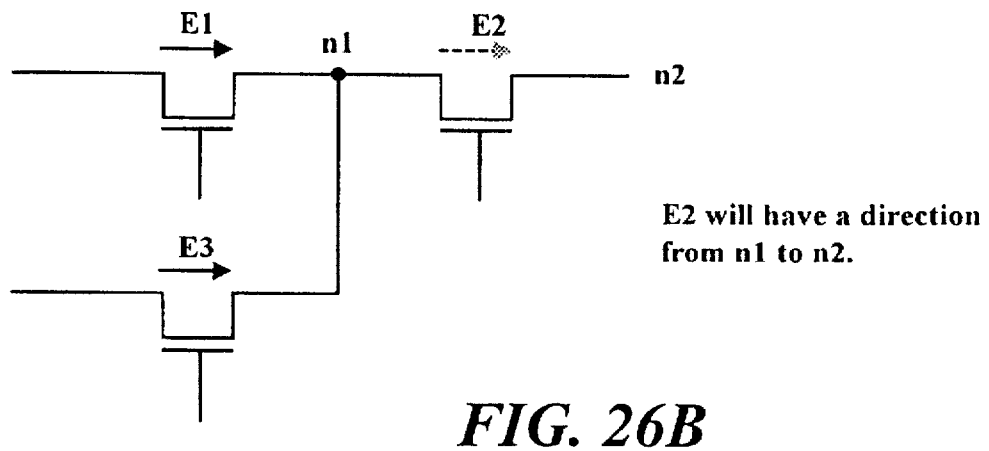
Figure 26C:
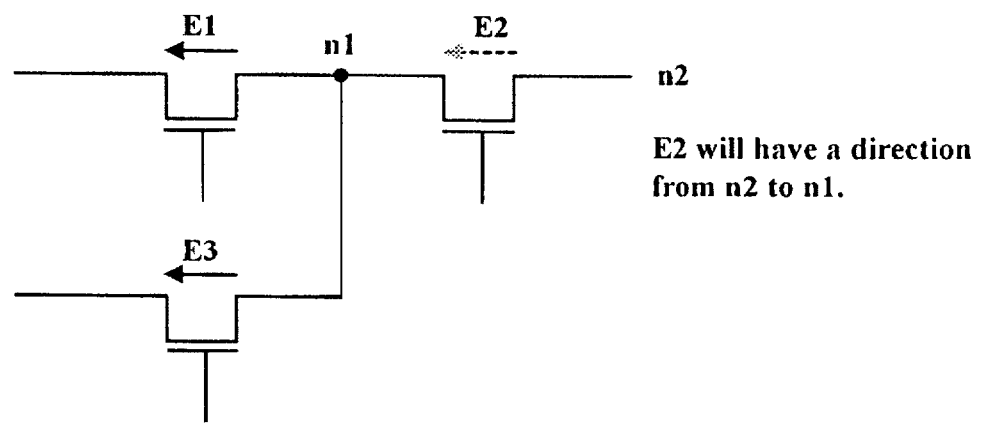

Rule 4: If the source of an element is connected to transistors with common directions (the gate terminal being viewed as the direction away from the source), then the direction of the element can be set. If all directions go toward source, as show in FIG. 26B, then the direction of the element is source-to-drain. Otherwise, the direction is drain-to-source as shown by FIG. 26C.

Timing Verification

The present invention performs timing checks during path searching. There are two classes of timing checks: specific and generic. A specific check applies only to specific blocks. (A block is a timing model or a sub-circuit described at the transistor level). Generic checks, on the other hand, apply to all cases. The user can direct that generic checks be performed.

In a preferred embodiment, there are two modes of verification: absolute delay mode and timing verify mode. In absolute delay mode, the present invention checks the absolute path delays against user-defined limits. In timing verify mode, the present invention performs all checks relative to global and local clocks with predefined waveforms. Preferably, the user will not mix the two modes of verification.

The timing checks available and how they are performed are described below. How the present invention checks for cycle stealing via transparent latches is also described below.

If the user specifies a timing offset for a source node, the present invention uses the offset when performing timing checks. For example, a user can specify that, with respect to a source node DATA, there is an extra delay of 2.5 nanoseconds (nsecs) for the arrival of a signal originating at source node DATA. The user can also specify that the timing offset can be determined with respect to a reference clock edge. For example, source node DATA has a timing offset of 1 nsec after the rise of a clock PH1. (The user can also specify the time a signal on source node DATA takes to rise or fall.)

The user can specify the required arrival time of a signal for a sink node. The present invention will check the arrival time of each path leading to the sink node and report the difference ("slack"). Preferably, the user can specify the arrival time in either absolute time or with respect to the edge of a reference clock. When specifying a required time with respect to a clock, it is best if the user defines the time with respect to the closing edge of the clock as if a hypothetical latch accepts it.

(Slack is defined as the required time less the arrival time for the longest path mode (setup time), and the arrival time less the required time for the shortest path mode (hold time).)

In the timing-verify mode, the user can define a set of reference clocks to specify input and output timing constraints as described above. Reference clocks can be external or part of the circuit under analysis. Preferably, the user can define any number of reference clocks.

The user can specify local clock nodes in sequential designs and the waveforms of the clock nodes. The specification preferably includes the initial logic value of the waveform, the time when the clock operation begins (the start time), the time when the clock will change after the start time, the clock's period and its rise and fall times. The user may also relate the external reference clock to which the clock node is connected. The present invention uses this information to check timing requirements relative to a global design clock. If a reference clock is defined, the user preferably also relates whether the logic relation between the local and reference clocks is inversion or identity. The specified clock waveform is propagated to the appropriate derived clocks. The derived clock waveforms are in turn skewed to account for delays through the circuit. The user can specify different technologies for maximum and minimum skews. The waveforms are also inverted according to the circuit logic.

The user can also direct the present invention to determine whether the clock pulse width time of a clock node meets user-specified criteria. The criteria include minimum and maximum times the clock can be LOW and the minimum and maximum times the clock can be HIGH. In a preferred embodiment, the user can specify default limits for all such clock nodes. The default default minimums are 0 and the default default maximums are period (cycle).

The present invention extracts the clock width from a combination of the minimum and maximum clock skew calculated to get the smallest pulse width for the minimum limit and the largest for the maximum limit. For example, the HIGH width of a clock for the minimum limit check is determined using the maximum skew for the rising edge and the minimum skew for the falling edge.

All timing failures are reported.

The present invention performs many different generic timing checks: data-to-latch, latch-to-latch, latch-to-output, data-to-output, data-to-gated clock, etc. Preferably, the user can direct with one command that the invention perform all of these checks.

The present invention processes path searching, pruning and all timing checks with delays relative to the clocks instead of absolute delays relative to the same source node.

Alternatively, the user can specify absolute delay timing requirements for data-to-latch, latch-to-latch or gated clock paths.

In addition to the generic timing checks described above, the user can direct the invention to perform block-specific timing checks. These checks are made for each instance of the block in the circuit. The present invention supports two check, setup time and hold time, and reports timing failures.

The setup and hold checks test the arrival times for source nodes against arrival times for reference nodes. The present invention compares minimum and maximum arrival times for both setup and hold. In order for the present invention to determine the minimum arrival time, it must do a shortest path search. If the user is not doing a shortest path search, the present invention uses the maximum arrival times for both the data and reference nodes.

Preferably, the reference nodes in the checks are clock node with a specified clock waveform.

To perform a setup check, the present invention checks that the maximum arrival time for the source nodes are less than the minimum arrival time for the reference nodes by the setup time. That is, maximum arrival time for the source nodes less the minimum arrival time for the reference node is less than the setup time.

If the source nodes or reference nodes are derived from a source node which has an offset or a clock waveform, the appropriate offset is added to the arrival time for those nodes. If the source node is triggered by a clock and the reference node is also a clock, the arrival time for the reference node includes an extra clock period.

To perform a hold timing check, the present invention checks that the minimum arrival time for the source node(s) is greater than the maximum arrival time for the reference nodes by the hold time. That is, the minimum arrival time for the source node(s) less the maximum arrival time for the reference node should be less than the hold time.

If the data or reference nodes are derived from a source node which has an offset or a clock waveform, the appropriate offset is added to the arrival time for the nodes. If the source node is triggered by a clock and the reference node is also a clock, the arrival time for the source node includes an extra clock period.

Where a signal is not automatically checked for setup time, the user can direct such a check, specifying the edge with the logic value of the source node (rising, falling or both), the reference node which sets the requirement on the node (this can be a clock node), the edge of the reference node with the logic value of the node (rising or falling), the time the source node is checked with respect to the reference node (the default is zero). Also, the user an specify that the clock edge is the trailing edge of the clock, i.e., the clock is active LOW rather than active HIGH.

Where a signal is not automatically checked for hold time, the user can direct such a check, specifying the edge with the logic value of the node (rising, falling or both), the reference node which sets the requirement on the node (this can be a clock node), the edge of the reference node with the logic value of the node (rising or falling) and the time the node is checked with respect to the reference node (defaulting to 0).

The present invention's default mode checks local timing violations according to user-defined limits. The timing verify mode is a superset of all timing checks and provides timing checks on a global level. In this mode, all timing checks are automatically enabled by the present invention, and there is no limit to the number of transparent latches.

In timing verify mode, the present invention assumes that all latches can be made transparent. A latch will be made transparent if the clock controlling the latch is on when the data arrives at the latch where the clock controlling the latch is in the same or next phase from the clock which triggered the data. Data arriving after the target clock has turned off will be considered an error. Data arriving before the clock turns on stops the path searching. On transparent latches, the present invention reports errors relative to the turn-off edge of the target clock.

In a preferred embodiment, the user can specify that searching is to continue beyond a latch with a setup time error. This is termed latch error recovery. In the resulting report, the present invention will mark each path which includes a latch failure with a special mark to alert the user of the failure. The delay of the flagged latch node will be adjusted to the turn-off time of the latch in order for path searching to continue. With this option the user can identify potentially large timing errors earlier.

In absolute delay mode, the invention assumes latches are non-transparent unless the user specifies that the present invention is to check for transparent latches when performing timing checks. In a preferred embodiment, the user may restrict how many levels of transparent latches are permitted on a path.

If a sink node or another latch does not follow a transparent latch, the present invention produces a warning message. Such a warning allows the user to check to make sure that no time borrowing has occurred without a corresponding check on a primary output or sampling point.

The user can instruct the present invention not to stop the path search at a specified clock-induced node but to deem the node transparent and continue searching through the node. In a preferred embodiment, the user can mark specific latch nodes as non-transparent.

(Should the user specify conflicting instructions, non-transparency overrides transparency.)

In timing verify mode, if the target clock and the clock controlling the previous latch are both derived from the same edge of the same reference clock, the two latches are expected to be in the same phase and the second latch will be expected to be transparent. The present invention will provide information about same phase latches if the user so instructs.

In timing verify mode, the present invention assumes all clocks can be propagated through static logic gates with an unlimited depth of propagation. In absolute delay mode, however, the present invention does not propagate clocks through static logic gates unless the user instructs the present invention to propagate clocks through any static logic gates regardless of the logic state on the input nodes. In a preferred embodiment, the user can specify the number of static logic gates after which the propagation will stop. Preferably, inverters are ignored with respect to the limiting number.

The present invention handles the gated clock implemented by a pass gate like a logic gate. The present invention propagates the clock signal through the drain and source connection if the user directs propagation through static logic gates as described above and the pass gate does not exceed the limiting number. The present invention counts each gated clock, whether it is a logic gate or pass gate. (The user can direct the end of the propagation of clock signals from a specified node when the signals propagate through structures which they should not in fact propagate through.)

The timing errors are reported in slack tables. There are two slack tables in the slack file: longest paths (setup) and shortest paths (hold). The default slack limit is zero, which means all negative slacks will be reported. The user can change the default at his discretion to either a positive or negative number. There is a setup/hold column which shows the setup/hold numbers, which either the user assigns, or are generated by the tool for transparency inside the model. The present invention reports the longest and shortest paths it finds.

The data-to-latch checking ensures that the delays for paths which start at source nodes and arrive at clocked transistors meet their timing requirements. The user can specify the timing requirements in two ways: user-defined maximum and minimum limits or clock waveforms. The delay for the source node includes any offset due to the source node on that path.

The latest time for data to arrive at a clocked transistor is the time the clock controlling the clocked transistor first goes active for non-transparent latches (i.e., goes HIGH for an N transistor or goes LOW for a P transistor). For transparent latches, the latest time is the time the clock turns off after it has first gone active. If the clock controlling the transistor is initially off, there is no minimum limit. Otherwise, the minimum limit is the time the clock first turns off.

Figure 19:
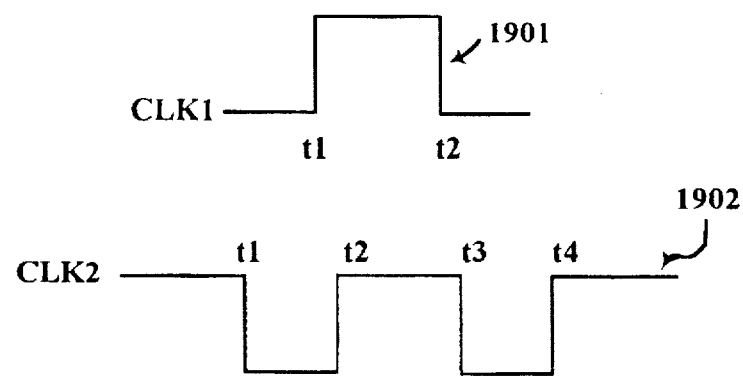
FIG. 19 shows waveforms useful for illustrating clock-derived data-to-latch limits.

FIG. 19 shows two waveforms useful for illustrating clock-derived data-to-latch limits. For the first waveform 1901, assume all clocks are active HIGH and no offset has been specified for the data input to the non-transparent latch. Then the maximum data-to-latch limit is t1, and the minimum data-to-latch limit is zero. If the latch is transparent, the maximum limit is t2. In the example waveform 1902, the maximum data-to-latch limit is t2 for non-transparent latches, t3 for transparent, and the minimum data-to-latch limit is t1.

If an offset with clock reference data has been specified, the data-to-latch limits are determined using the same method as for latch-to-latch limits.

The latch-to-latch check ensures that the delays for data leaving clocked transistors and arriving at other clocked transistors meet their timing requirements. The timing requirements can be specified in two ways: user-defined maximum and minimum limits or clock waveforms. The latch-to-latch delay is the total delay for the path, starting at the source clock up to the target clocked transistor, less the delay of the source clock to reach the triggering clocked transistor.

Figure 20:
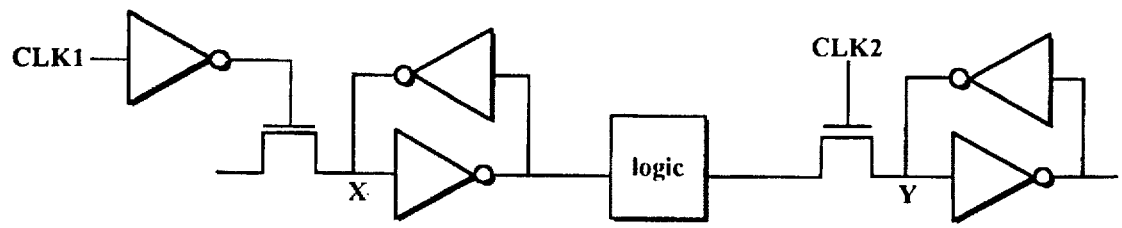
FIG. 20 is a circuit schematic useful for illustrating latch-to-latch checking.

FIG. 20 is a circuit schematic useful for illustrating latch-to-latch checking. The path delay from latch node X to latch node Y is equal to the delay from source node CLK1 through node X to node Y and the latch-to-latch delay is equal to the delay from node X to node Y.

To determine the limits for each latch-to-latch delay, the following rules are used (The trigger clock is the clock controlling the first latch, and the target clock is the clock controlling the second latch.):

Rule 1: The maximum limit for non-transparent latches is the next time the target clock turns on after the trigger clock turns on less the time the trigger clock turned on. For transparent latches, the maximum limit is the next time the target clock turns on plus the time it is on less the time the trigger clock turned on.

Rule 2: The minimum limit is the next time the target clock is off after the trigger clock turns on, less the time the trigger clock is turned on. The minimum must be less than the maximum limit; otherwise, it is zero.

Figure 21:
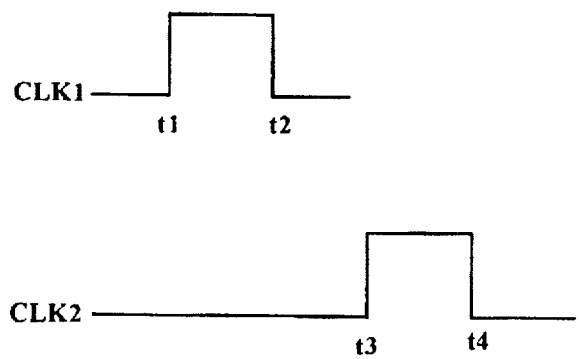
FIG. 21 shows two waveforms useful for illustrating clock-derived latch-to-latch limits.

FIG. 21 shows two waveforms useful for illustrating clock-derived latch-to-latch limits. Assume all clocks are active HIGH and clk1 is the trigger clock. Then the maximum latch-to-latch limit is t3 less t1 for non-transparent latches, and t4 less t1 for transparent latches. The minimum latch-to-latch limit is zero.

Figure 22:
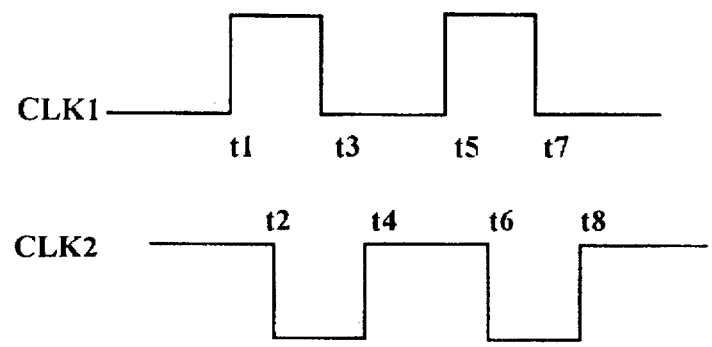
FIG. 22 shows two waveforms useful for illustrating clock-derived latch-to-latch limits.

FIG. 22 shows two waveforms useful for illustrating clock-derived latch-to-latch limits. Assume all clocks are active high and clk1 is the trigger clock. Then the maximum latch-to-latch limit is t4 less t1 for non-transparent latches, and t6 less t1 for transparent latches. The minimum is t2 less t1.

The data-to-gated clock check ensures that the delays for data arrive in time at gated clocks. The timing requirements can be specified in two ways: user-defined maximum limits or clock waveforms.

Figure 23:
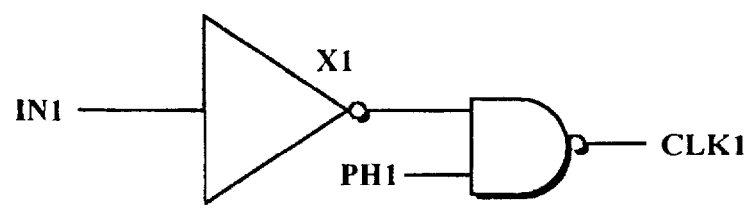
FIG. 23 shows a circuit schematic useful for illustrating gated clock checking.

FIG. 23 shows a circuit schematic useful for illustrating gated clock checking. The present invention will check the arrival time of node X1 against node PH1.

Figure 24:
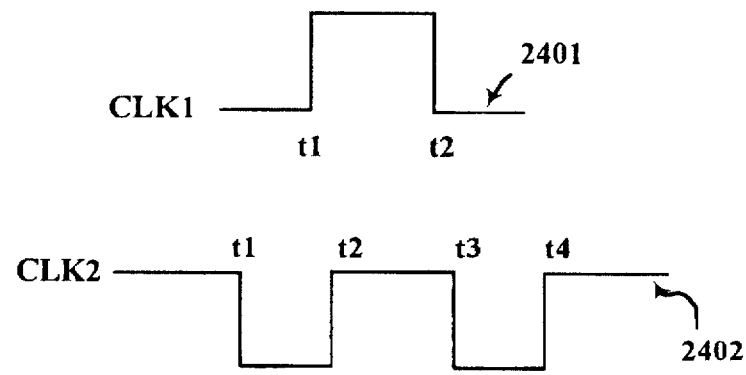
FIG. 24 shows two waveforms useful for illustrating gated clock checking.

Data must arrive at a gated clock before the clock controlling the gate switches on. FIG. 24 shows two waveforms useful for illustrating gated clock checking. Assume all clocks are active HIGH. Using waveform 2401, the maximum data-to-gated clock limit is t1. With respect to waveform 2402, the maximum data to gated clock limit is t2.

The time the gated clock goes active is determined relative to the reference clock controlling the data, in the same fashion as the data-to-latch and latch-to-latch checks.

FIG. 16 shows a clock waveform and domino logic useful for illustrating domino logic timing checks. Falling data on node d1 should arrive before t1. The rising data on node d2 should arrive before t2, using transparency. With non-transparency, rising data on node d2 should arrive before t1.

The present invention selects the next active edge of the target clock which occurs after the active edge of the trigger clock. This, however, may not be the edge which the user wants to check against. For example, the path may be permitted to take more than one clock cycle, or the next edge may not be the next cycle but a skewed edge for the same cycle. In a preferred embodiment, the user can adjust the time the trigger clock is deemed active.

Figure 25:
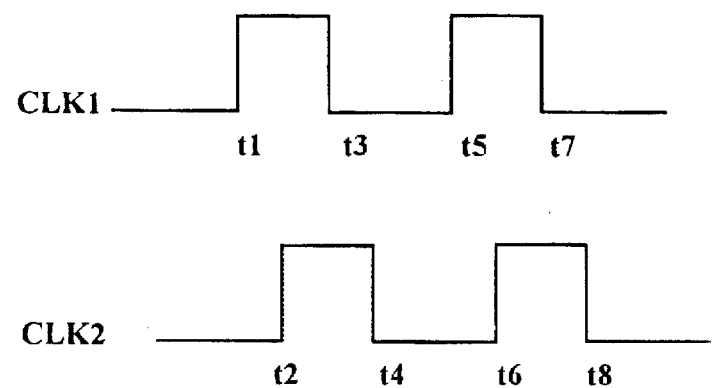
FIG. 25 shows two waveforms useful for illustrating adjustment of a clock edge.

FIG. 25 shows two waveforms useful for illustrating adjustment of a clock edge. Assume that all clocks are active HIGH and that there are no transparent latches. Then the maximum latch-to-latch clock limit is t2 less t1 and the minimum latch-to-latch limit is 0. If the user specifies an edge tolerance greater than t2 less t1, the maximum latch-to-latch limit becomes t6 less t1 and the minimum latch-to-latch limit becomes t4 less t1.

Gray Box Modeling

The present invention will generate a gray box model for the circuit under analysis if the user so directs. Alternatively, the user may compile a gray box model manually. Programmatic generation of the gray box model occurs in conjunction with the circuit analysis described above. The present invention searches from primary clock inputs and analyzes all the internal paths between sequential elements. The present invention saves the worst and best paths between all the sequential elements, the worst paths between primary inputs and the first layer of sequential elements as well as the worst paths between the last layer of sequential elements and the primary outputs. The present invention determines the delay from a primary clock to a clock pin of a sequential element only at the end of the analysis while producing the gray box block model as output.

The process of collecting data for the gray box model is very efficient since the present invention processes only the paths between two sequential elements which contain purely combinatorial gates. When generating a gray box block model, the present invention does not process paths which go through a sequential element requiring transparency.

For each processed path, the present invention saves the maximum and minimum delays as well as the delays for the different logic conditions (i.e., a rising and a falling signal) on the first and last node of the path.

The worst and best case data the present invention stores if there are multiple paths between the start and end points. In a preferred embodiment, the present invention hashes data to be stored in order to achieve faster access.

At the end of the circuit analysis, the present invention produces the gray box model data. In addition to this gray box data, the present invention writes setup and hold times for each primary input. This additional data provides the ability to switch between gray box and black box blocks at the full chip level without the need to generate or regenerate the corresponding black box model.

FIG. 27 shows the template for gray box model data in a preferred embodiment. FIG. 28 shows an example declaration section for a gray box model according to a preferred embodiment. FIG. 29 shows an example gray box model according to a preferred embodiment, for a pm__model circuit. Such models can be stored in files external to the present invention and presented as input to the present invention. For clarity in describing gray box block modeling, the following disclosure is presented in the context of the preferred embodiments of FIGS. 27 and 28. However, as is readily apparent to one of skill in the art, the underlying concepts may find expression in formats other than that of the preferred embodiment. For example, a different programming language or different languages can be used, and the order of sections or subsections can be altered.

A model has two sections, the declaration section and the model body. The declaration section defines signal names for the model and declares the type of each named signal as input, output or biput (bidirectional). In the model body, the user creates whatever kind of model is necessary using the functions and other features of the programming language in which the model is written. The preferred language is C or a C-like language.

The basis of interaction between a model and the present invention is through the INPUTS, OUTPUTS, BIPUTS and STATES declaration sections of the model. Accordingly, in a preferred embodiment, the order and number of input, output and biput signals in an instance call of a block model must match the order of the inputs, output and biputs defined in the corresponding timing model. The user must declare the input, the output and the biput ports of the circuit to be modelled. (A biput port can function as both an input and an output port.) If the present invention is generating the model, then it derives the needed information from the specifications of source and sink nodes previously provided by the user, as described above. Each declared I/O port is either a single-bit signal or an bit signal, as respectively indicated by the SIG() and BUS() declarations in FIG. 28. In FIG. 28, APP, BPP, and clk are single-bit input ports and p, QQ and res are single-bit output ports. IN__bus is an eight-bit input bus, comprising signals IN__bus[0], IN__bus[1], . . . , and IN__bus[7]. (A bus declared by BUS() is zero-indexed.)

The function of a model may be dependent on the past state of the model. The present invention allows the user to maintain state information about a model in variables local to any instantiation of the model. This maintenance of state information as specified by the user is the purpose of the STATES subsection of the declaration section. In FIG. 28, mem is a 3-bit bus for maintaining the internal state of the XYZ model.

In the preferred embodiment, the present invention provides the user a number of functions with which to describe the behavior of the model in the model body. The functions are particularly directed towards describing the delays and timing checks applicable to the model.

The functions are divided into six categories: logic state assignment, capacitance, event recognition, delay, timing verification and transparency. These six categories and the functions in them are addressed in turn below.

When a path search reaches a timing model, i.e., when a propagated signal reaches an instantiation of a timing model, the present invention evaluates the timing model with a change on one of its inputs or biputs. The particular input or biput will have a logic state of 1 or 0 when the model is evaluated. All other inputs, biputs and outputs will have an undefined state except for those nodes which the user has set to a fixed logic state, as described above.

For an input or biput which causes an output to always be the same state as the input or biput, the logic relationship is preferably an assignment, for example:

out=in;

For inputs and biputs which causes outputs to always be the inverse of the inputs or biputs, the logic relationship is preferably specified using an inverse function, for example:

out=vinv(in);

For a control signal the output state of which does not depend on the state of any input, the user preferably makes no logic state assignment but instead assigns delay values to the output as described below. The present invention will search both the rising and falling paths from such an output node.

In order that terminal capacitive loading contribute properly to the evaluation of the driving circuit, the user must specify an input capacitance for each input or biput terminal. Allowing the user to assign the capacitance for an output reflects the fact that output pins can have high capacitances of their own independent of the loading condition. In a preferred embodiment, functions are provided to specify terminal capacitance.

These functions span a two-dimensional space, where the first dimension describes whether the terminal is an input, biput or output and the second dimension describes whether the terminal is a single-bit or a section of a bus. (Of course, if the terminal is a section of a bus, the function must establish intrinsically or with parameters the specific individual signals of the terminal bus to which the function call applies.)

Once a timing model is incorporated in a circuit, the present invention checks the range of output loadings and reports violations. The user will also need to instruct the present invention to check the output loading and input slope for a functional model when building the timing model, specifying-the high and low loads for single-bit signals and groups of signal bits.

In order to enable the user to specify the pin-to-pin delays in a model, the present invention provides functions which inform the user of which input or biput caused the evaluation of the model. These functions span the two-dimensional space of input or biput versus single-bit signal or signal bit group. The functions announce the arrival of an event by returning a first predetermined value and announce that no event arrived at a particular signal or group of signals by returning a second predetermined value.

The present invention provides functions which assign an intrinsic delay plus a drive and slope actors. The user can specify the output drive capability with the equivalent transistor width and length or the effective output resistance. (In a preferred embodiment, the intrinsic delay is defined as the input to output delay with an input signal of 0.001 nsec rise or fall time with zero output capacitive loading.) These functions span the three-dimensional space of input or biput signal, single-bit versus bit group signal, and driving up or driving down. The present invention determines the actual drive strength for a particularly sized device from the technology file.

The present invention also provides a set of functions to perform setup timing checks and another set to perform hold timing checks. The user specifies the setup or hold time required, the clock signal to be used for a time reference, which data edge to check against which reference edge and whether the sampling edge of the clock is the trailing (turn off) edge or the leading (turn on) edge. Transparent latches use the trailing edge in setup time checks. Each set of functions spans a two-dimensional space of single-bit or group bit signals versus input or biput signal.

The present invention provides two functions for modeling gray boxes: a latch delay function and a clock delay function. The latch delay function describes the pin-to-pin delay between a source node and a latch point, between latch points and-between a latch point and a sink node.

The clock delay function describes a pin-to-pin delay from a primary clock (a source node) to a local clock which controls a latch. The present invention determines the delay up to the clock node only. The user the maximum and minimum delays, whether the logic value is rising or falling, whether the latch is active HIGH or LOW, whether the latch is transparent, the delay from the latch clock to the output on a rising signal and the delay from the latch clock to the output on a falling signal. The user also specifies the maximum and minimum resistance.

For a path that is going to a primary output, the present invention uses the drive resistance of the output driver to adjust the output delay based on the external load when using an instantiation of the gray box model. Each internal latch of the gray box retains the transparency property, so when the present invention analyzes this block both transparent and non-transparent latches are supported. For example, if a non-transparent gated clock is fully represented in the gray box model, the present invention will provide gated clock timing checks just as in transistor-level circuit analysis. The clock delay function includes the delay from the clock pin of the sequential element to the output pin of the sequential element. The present invention uses this data to analyze paths that are going from the clock to the output of the latch.

USING THE GRAY BOX

The present invention provides a mixed-mode, full-chip timing analysis for circuits which consist of gray boxes, black boxes, transistor and RC elements. In a timing verify model, the gray box is automatically enabled, which means that for a block that has gray box data in the timing model, the data will be read and used if necessary. The user can turn off the gray box data usage. In this case the black box will be used instead of the gray box. For efficiency reasons, the present invention processes the gray box data only if the path searching in the present invention reaches the particular block. If the path searching does not touch a block, then no timing model data is processed. Once the analysis touches a block with gray box data, the present invention then reads and processes the gray box data from the timing model file.

The present invention constructs a graph from the gray box data. The graph represents the gray box elements and the associated connectivity. The elements are internal sequential cells, and each such cell becomes a node in the graph. The delays, which connect all of the sequential elements internally and connect sequential elements to the primary inputs and outputs of the block, are represented by timing arcs. The present invention uses hash functions to store and retrieve graph nodes during the process of reading gray box data. Hashing, as described above, provides fast access to a stored node which has multiple arcs going in or out. In the data structure corresponding to a node, the present invention stores the connectivity of which arcs are going out of the node and the attributes that are associated with the latch, such as the transparency attribute, clock-to-output delay, etc. With the data structure corresponding to a timing arc, the present invention saves the delay for the different conditions (e.g., maximum and minimum and rising and falling edges).

Once the present invention has constructed the graph, the next step in using a gray box model is the propagation of clock waveforms inside the model. This step is triggered by a global clock hitting a clock pin of the gray box during the propagation of the global clock, described above. Then the present invention propagates the external clock waveform inside the gray box to the clock pin of all the relevant latches inside the gray box. Both the maximum and minimum delays as well as rising and falling edges are propagated to get a full clock waveform on every internal latch. For example, if a latch is active HIGH (i.e., a logical 1 on the clock activates the latch), the present invention must have the maximum and minimum delays also for the falling edge of the clock in order to perform a full set of timing checks. In addition, the present invention saves the causing clock edge of each event of the internal clock waveform in the gray box latch node data structure in order to trace the clock tree and the reference clock while doing the timing checks and the transparency condition check.

The next step is the analysis of the data inputs going into the gray box models. As explained above, the present invention analyzes the data of the gray box only if the global path search hits a data input of a block that has gray box data. Even then, the present invention analyzes only the relevant cone of the graph (i.e., portion of the circuit, starting from an input and continuing to an output) that is connected to this input. The rest of the gray box graph is still inactive. The present invention performs the gray box path search using a depth-first search, starting from the hit data input of the block and searching through the timing arcs of the graph, crossing any transparent internal latch node, going to an output of the block and continuing the global path search from the output of the block. The search starts by taking the arrival time on the input of the block which includes the reference clock that generates the data in order to check the setup and hold time on the internal latches. Then the present invention propagates the input arrival time through the timing arcs of the gray box graph to the first layer of latch nodes connected to this input. The new arrival time is saved on the other end of the timing arcs in order to prune future paths—if the user has not disabled path pruning. Then, based on the new arrival time on the internal latch node, the present invention performs timing checks that determine in which phase and cycle the latch is supposed to sample the data and when the data arrives with respect to the clock. If data arrives too early, then the gray box path search stops at this latch node, and positive slack time can be reported. If the data arrives when the latch is on and the latch is transparent by design, then the path search continues through the latch, and positive slack can be reported. If the path arrives after the latch turns off, then the path search stops, and a setup error is reported. If the user has directed latch error recovery, the path search will continue with an adjusted time on the latch output. Whenever slack is reported, the path details are preferably reported as well. If the present invention is in a phase of checking minimum delays, then it checks the hold time with respect to the correct edge. The slack is reported, and the path search always stops.

As part of the timing checks, the present invention uses information about the generating clock as well as the sampling clock. Therefore, the present invention propagates the clock information along with the path search in order to modify the clock information whenever the path search crosses a latch from the data input.

If the gray box path search starts from a clock input of the block, then after the propagation of the first timing arcs the present invention comes to a latch from the clock pin. Therefore, no timing checks are provided. Before the path search continues from this first latch, the present invention adds the clock-to-output delay of the latch. The path search then continues from the output node of the latch.

The user can control the depth of the path search by directing the present invention to limit the depth of transparency. The present invention will limit the search to the number of transparent latches specified by the option. This option can be used if the design disallows unlimited transparency—or to run the verification first with a small number of transparent latches to get the first few errors in the design and to check the interface between blocks and then increasing the limit for more exhaustive timing verification. (Of course, if the user limits the transparency depth to zero, then transparency is disabled.)

If the path search inside the gray box reaches an output pin of the block, a transparent path from a block input to the output exists. In this case, the present invention adjusts the delay based on the output load. The output drive resistance of the last timing arc is used for the delay adjustment. The output can be loaded by a lumped capacitance, by reduced or detailed RC data, or by pass gates connected to this output through the source/drain ports. Where loading is modelled by RC or pass gates, the present invention performs a detailed device level simulation using the output drive resistance to achieve high delay accuracy. Once the delay is adjusted, the global path search of the present invention continues from the output of the gray box model to the rest of the circuit which can be a transistor-level circuit or black or gray box blocks. In order to provide correct timing checks when going out of a gray box block, the present invention passes the arrival time and the reference clock information to the global path search.

A path search using a gray box block model reports the slack and the path information the same way as in a transistor-level analysis. With each internal latch slack, the present invention reports the arrival time (both absolute and relative to the clock) as well as the setup and hold times, consisting of the internal data and clock times. The setup time is reported for an internal path even if the path goes through transparent latches. This reporting allows the user to get a setup time for a specific external condition that the user sets. In general, the retention of the data in the reports allows the present invention to generate and drive black box models out of the gray box model for different environmental conditions.

The hold time is reported the same way.

In a preferred embodiment, when the user enables transparency, the present invention will report internal information such as the internal node name at the end of the path, the data arrival time at the gray box latch and the internal clock waveform.

The size of data involved in gray box block modeling can be critical for large and complex design blocks. In order to minimize the problem, the present invention takes a few steps to reduce the size of the gray box model.

First, with large blocks (i.e., blocks with more than 500 latches), the present invention automatically generates a text file with a simple format rather than the C model file. The simple format text file has a simpler syntax (though less information) and therefore is smaller in size. The present invention can also convert internal node names (which can be quite long) into unique numbers (in the process generating a cross reference which is not part of the gray box data file). The present invention reads the text file directly without compiling it. This saves a lot of time on large models where compilation and link time can be very long. Since the text file syntax is simpler, the file redesign is very fast.

Second, the present invention uses bus compression. The user defines the buses that he wants to compress and the maximum error allowed. The present invention will recognize the buses by the name and based on the model connectivity it will try to compress the bus to a single entity in the model if the maximum different between the bits of the bus is smaller than the difference allowed by the user. The present invention can group partial buses when the entire bus cannot be compressed. For example, if a 64-bit bus has maximum difference of 0.5 nsec while the user allows a difference of only 0.1 nsec, then it might be possible that by splitting the bus into, say, 2 subgroups. The difference within each subgroup can be 0.1 nsec or smaller. This would allow the present invention to a generate smaller model (2 arcs instead of 64 arcs). The bus compression is very user-friendly since it does not require the knowledge from the user on the connectivity of the buses. The present invention will find the right connectivity and will group only the relevant bits. Different bits of the same bus do not have to have similar connectivity.

Using the bus compression technique described above, the present invention was able to reduce one example model file by two orders of magnitude in size, from 50 megabytes to 0.5 megabytes.

Also, the bus compression is very fast since it uses a sorting technique before the compression starts. At the end of the path searching and before writing the model file, the present invention sorts all of the records in the model data base. For all the pin-to-pin delays (no clock), the present invention sorts all the records, in alphabetic order, with the input first and then the output. The present invention takes special care when dealing with bus names since the sorting is different: BUS<2> should come before BUS<10>. The present invention therefore checks if a node name is a bus and, when comparing two names for the sorting, isolates the bit of the bus first in order to get the right order. The basic sorting algorithm is a merging sort, with the present invention controlling the order of the names.

An example of the result is:

A<0>→B<5>

A<0>→B<6>

A<0>→B<7>

A<0>→B<8>

A<5>→C<0>

A<5>→C<1>

The order of the timing arcs allows the present invention to group all of the buses in one pass. The present invention starts, with A<0>, for example, and continues until the bit of the start node changes, to A<5>, for example or the bit of the end node changes. The present invention then stops and groups, A<0>→B<5–8>, for example, based on the maximum difference between the different timing arcs. The present invention then continues, to A<5>, etc., for example.

The third technique for reducing the size of gray box model data involves non-transparent latches. In some designs, the user may want to generate gray box data only if there is transparency from input to output of the corresponding block, without checking internal paths. For this case, the present invention will generate a mixed model of transparent and gray boxes. For those paths that stop at non-transparent latches, the present invention will generate a transparent model which is the setup time to the last latch while considering all the latches along the path. The setup time is generated by propagating backward the setup time on the last latch to the previous latches (when the latch is ON) and taking-the worst setup time coming from all the latches along the path. For those paths that have only transparent elements and start from a non-clock data input, the present invention will still generate gray box data. This also gives the user the control to eliminate sections of the design from the gray box model. The user can mark globally all the precharge elements as non-transparent elements. With this mixed mode of transparent & gray boxes, all the paths which cross precharge elements will not be in the gray box.

Fourth, after reading the gray box and analyzing the paths from a particular input, the present invention will record the condition which allows the data to be transparent. Therefore, the next time that the present invention comes to the same input, it won't search inside the gray box. Instead, it will use the conditions stored to detect whether there is possible transparency to the output of the block. This relaxation mode is also useful for users who are interested only in transparency between blocks but not in internal paths verification.

The user can direct the present invention to generate a black box model based on the transparency conditions in the circuit. For example, a path from a source node through a transparent latch to a sink node is printed as a delay between the source and sink nodes. The setup and hold times are generated with respect to the last latch (which is not necessarily the first latch). In this way, the user can obtain a gray box snapshot for the specific environment of a clock waveform and input arrival time only.

Figure 1:
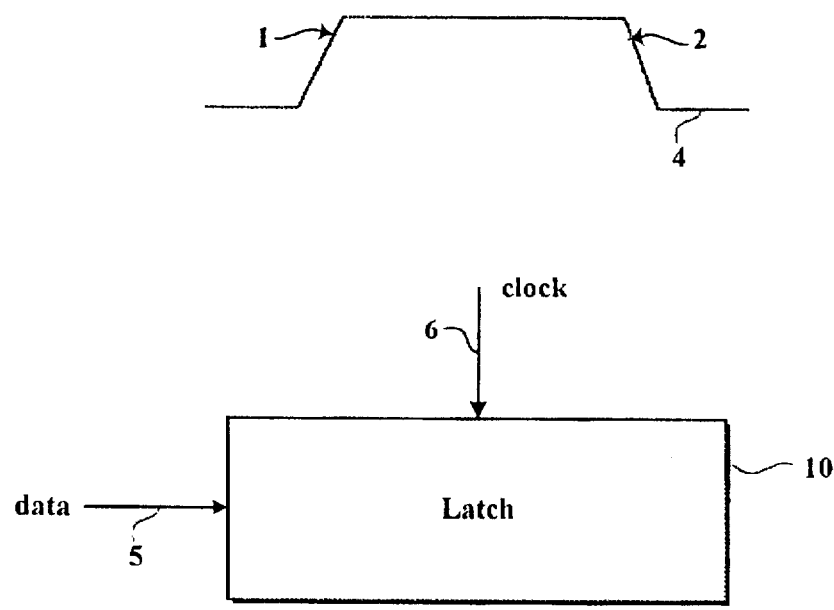
FIG. 1 shows a latch for which a modeler would derive setup and hold times.
Figure 2:
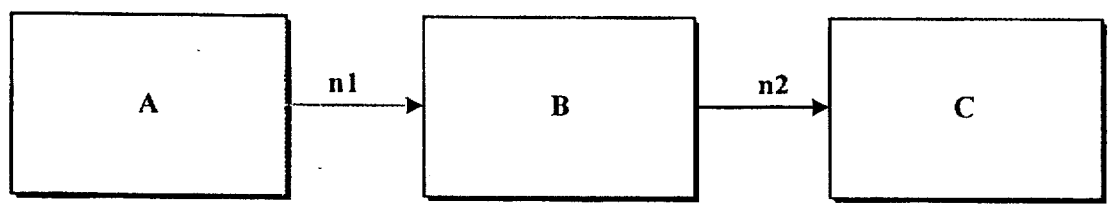
FIG. 2 shows a sequence of black boxes which can illustrate the limitations of black box modeling.
Figure 3:
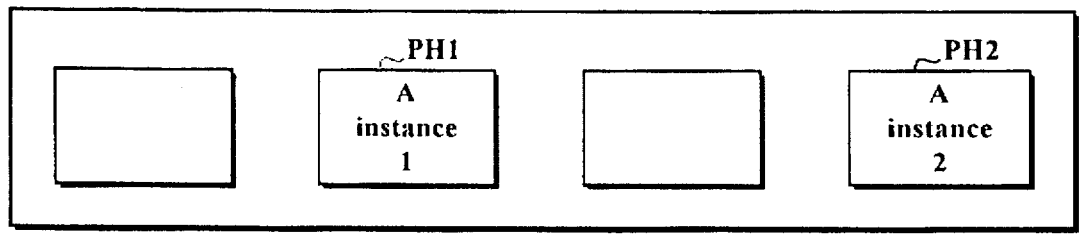
FIG. 3 is a block diagram.
Figure 4:
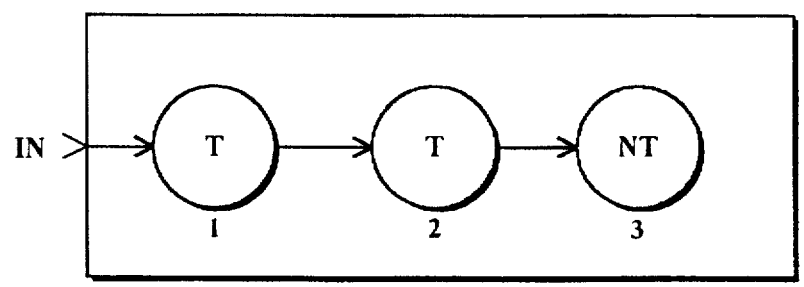
FIG. 4 is a block diagram useful for illustrating the generation of a black box model based on transparency conditions.

FIG. 4 is a schematic useful for illustrating the generation of a black box model based on transparency conditions. In this case, the worst setup time will be calculated by taking the worst of 3 cases:

1. the setup time to transparent latch 1;
2. the setup time to transparent latch 2 going backward through transparent latch 1, ensuring that the setup time is realistic and was determined when the latch was open; and
3. the setup time to non-transparent latch 3 going backward through transparent latch 2 and through transparent latch 1 (same approach as case 2).

Figure 30:
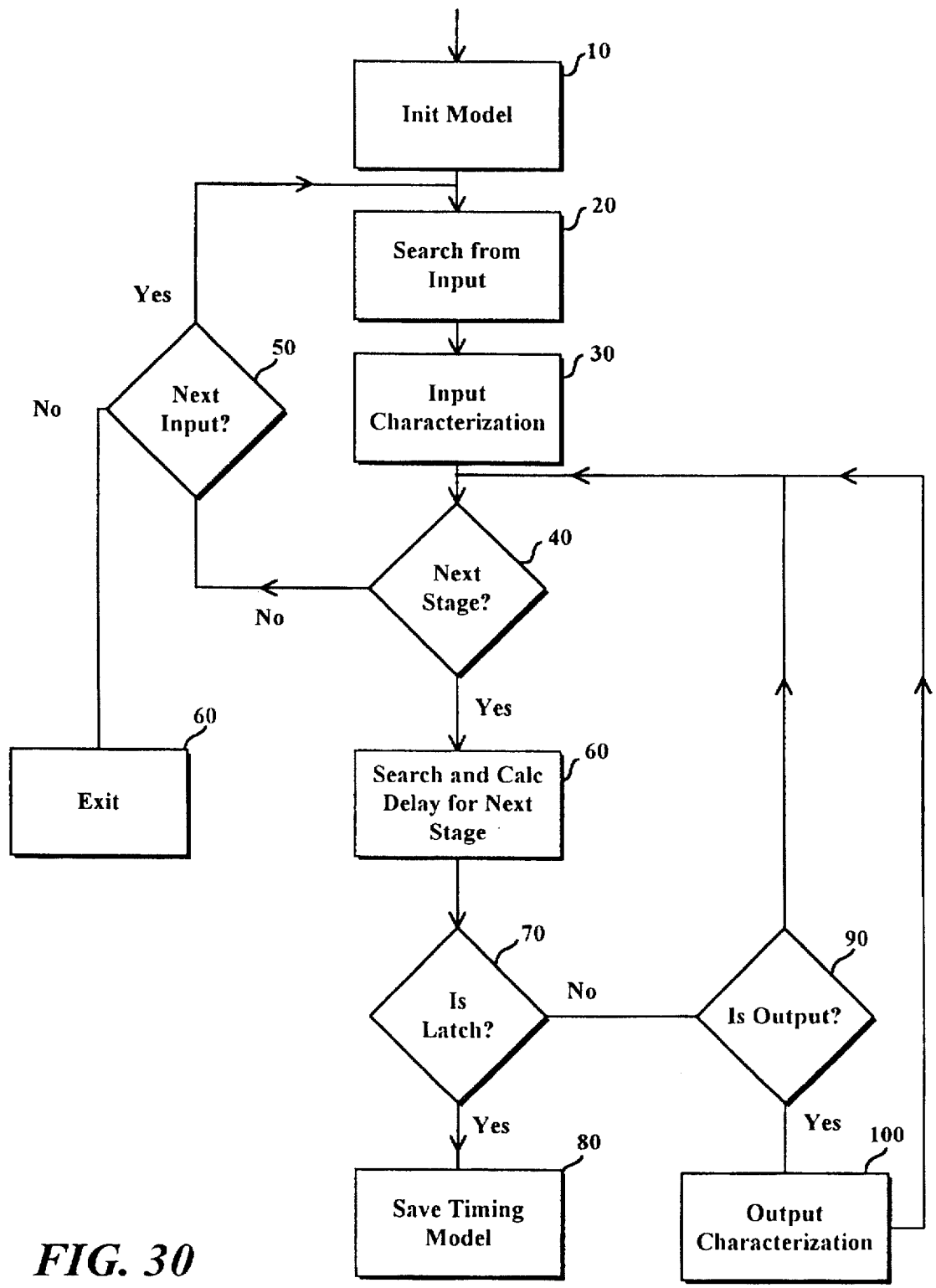
FIGS. 30 through 35 are flowcharts describing the generation of a timing model.

FIGS. 30 through 35 are flowcharts describing the generation of a timing model. FIG. 30 begin with step 10, the initialization of the data structure which will eventually contain the gray box block model data. This step is described more fully below. After the model data structure is initialized, the present invention initiates a path search from an input pin, step 20. The input pin is characterized, step 30, and the graph checked to determine whether, on this path, there is a stage following the input pin, step 40. If there is not, the present invention moves on to the next pin, if one is available, steps 50 and 60.

When there the next node in a search path is a stage, the present invention extends the path search to the node of the next stage and calculates the delay to this next node, step 60. Where the current arc leads to a latch, the present invention saves the timing model generated thus far, step 80. Where the current arc leads neither to a latch node nor an output pin, step 90, the present invention loops to check for another stage at step 90. Where the current arc leads to an output pin, the present invention characterizes the output pin at step 100.

Figure 31:
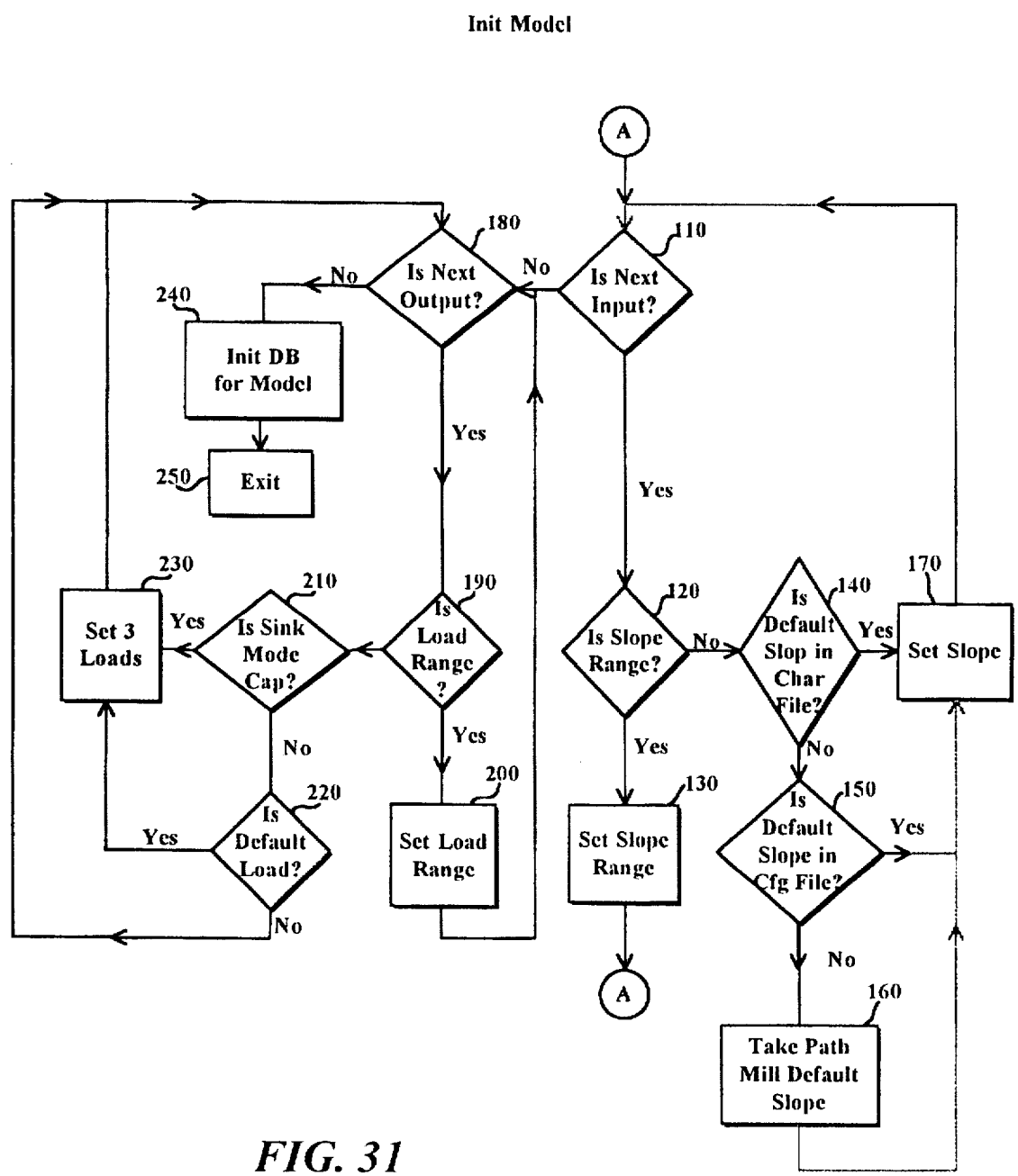

FIG. 31 more fully illustrates the initialization of the timing model data structure, step 10. In the loop headed by step 110, the present invention walks through the declared input pins. For each input pin, the present invention checks whether the user has specified an input slope range for the instant input pin, step 120, and if so, sets the slope range of the input pin at step 130. Where the input slope range has not been set, the present invention checks the characterization file for a default slope and uses that default if found, steps 140 and 170. Where the input slope range has not been set and there is no default slope in the characterization file, the present invention will first check the configuration file for a default slope and use that, if found, steps 150 and 170. When no slope has been specified and no defaults have been specified, the present invention steps the slope range according to its own defaults, step 160, preferably 1 nsec.

Once all the input pins have been walked through, in the loop headed by step 180, the present invention walks through each of the output pins declared by the user. The present invention checks whether the user has specified an output load range for the instant output pin and, if so, sets the load range for the pin, steps 190 and 200. Where the user has not so specified, the present invention checks, at step 210, whether the user specified an external capacitance on the instant node when the node was declared a node for terminating path searches. If so, the present invention sets three loads, 0.5 times, 1 times and 2 times the capacitance value, step 230. Where the user has not specified a output load range or an external capacitance for the instant pin, the present invention next checks whether a default output loading has been specified, step 220, and uses that information to set the three loads. Where the user has specified no particular or default loading characteristic, the present invention does not set any loading characteristic for the instant pin.

Having walked through all of the declared input and output pins, the present invention then initializes the data structure which will contain the gray box model data and exits, steps 240 and 250.

Figure 32:
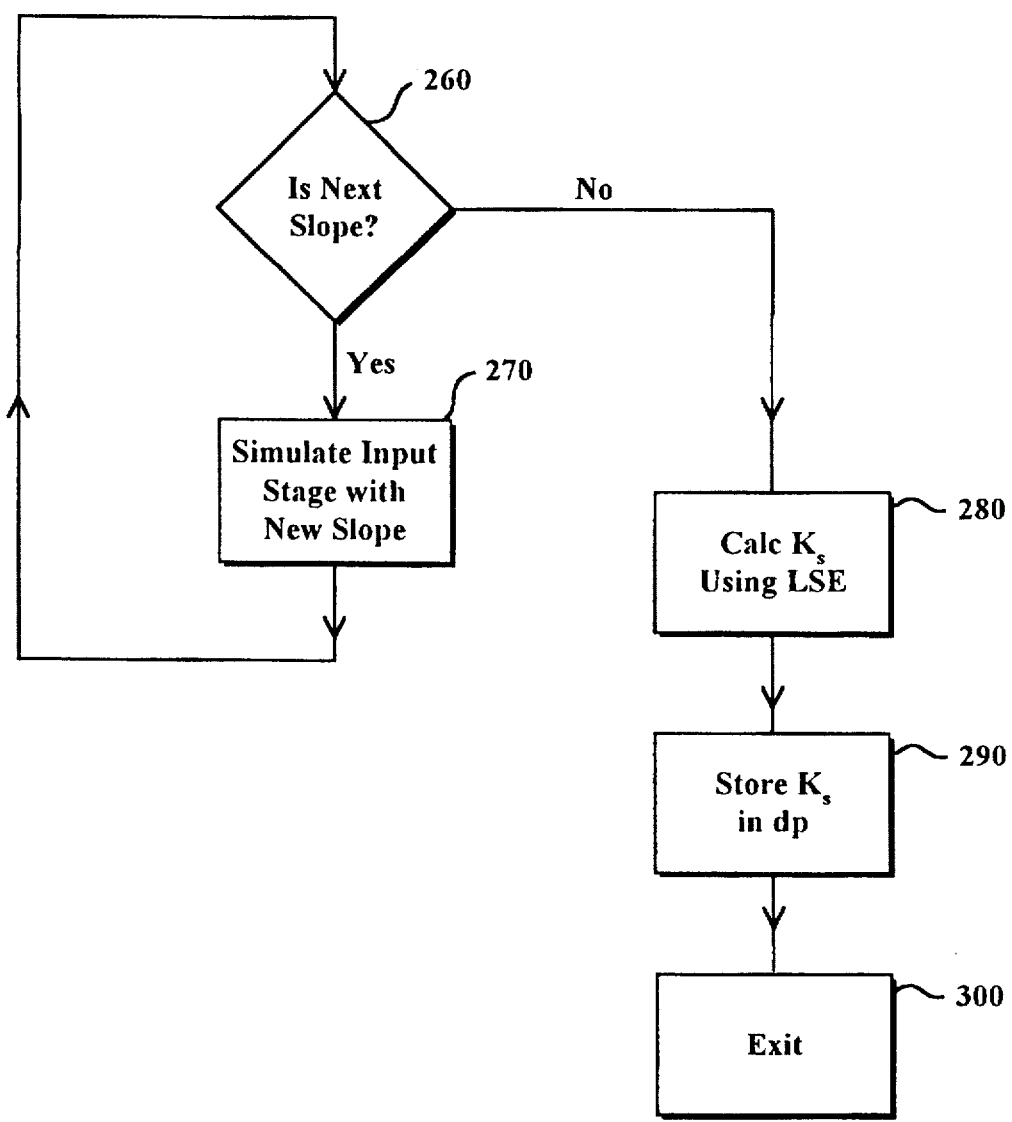

FIG. 32 more fully illustrates the characterization of an input pin, step 30. In the loop headed by step 260, the present invention walks through each of the slopes possible for the instant input pin and performs a simulation, step 270. The present invention then calculates the slope input factor, $K_s$, and stores that information in the data structure for the gray box model, steps 280 and 390.

Figure 33:
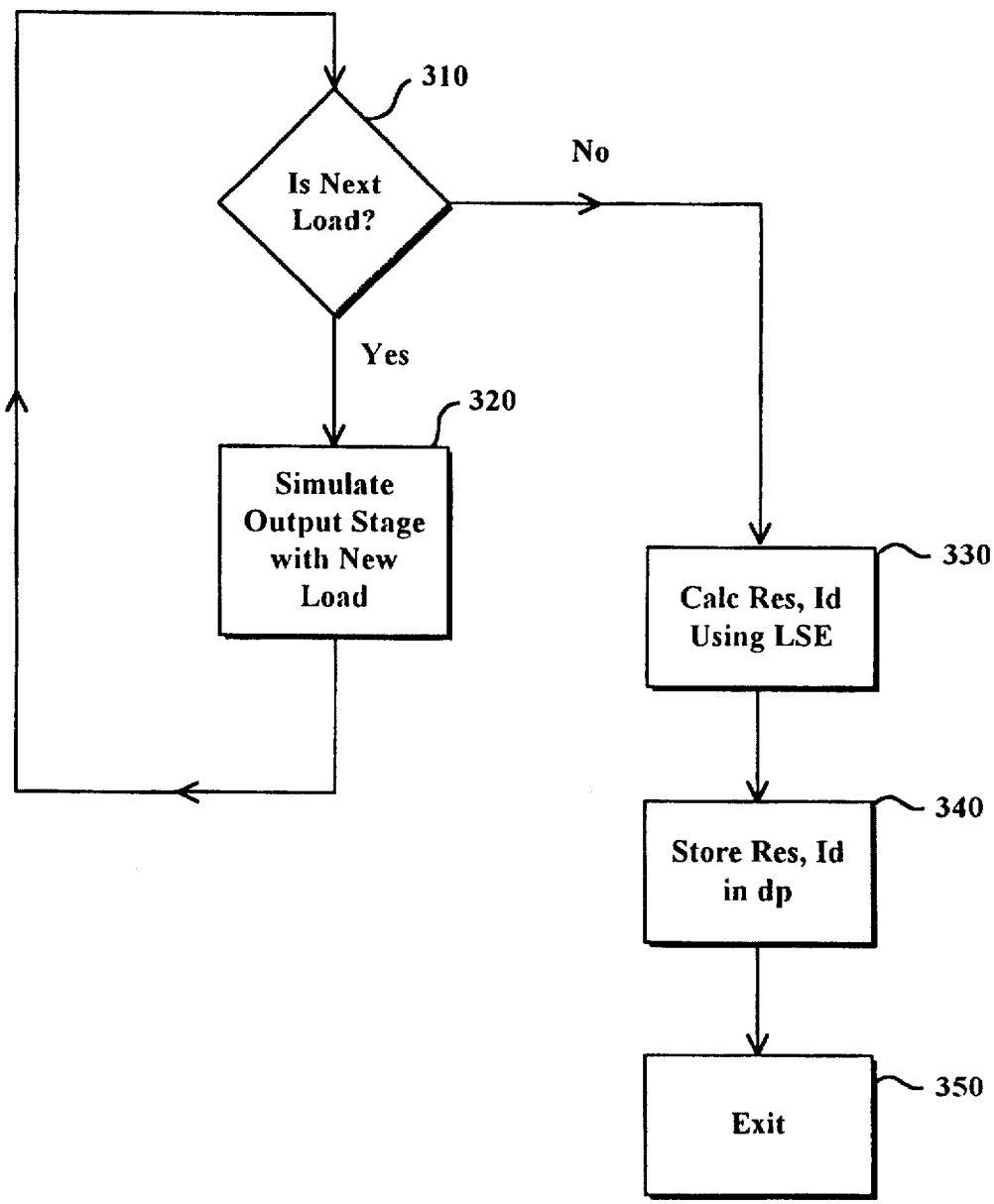

FIG. 33 more fully illustrates the characterization of an output pin, step 100. In the loop headed by step 310, the present invention walks through each of the loads possible with the instant pin and performs a simulation, step 320. The present invention then calculates the drive resistance, $R_s$, and the intrinsic delay, $I_d$, using a least squares error (LSE), step 330. $R_s$ and $I_d$ are stored in the data structure representing the gray box model at step 340.

Figure 34:
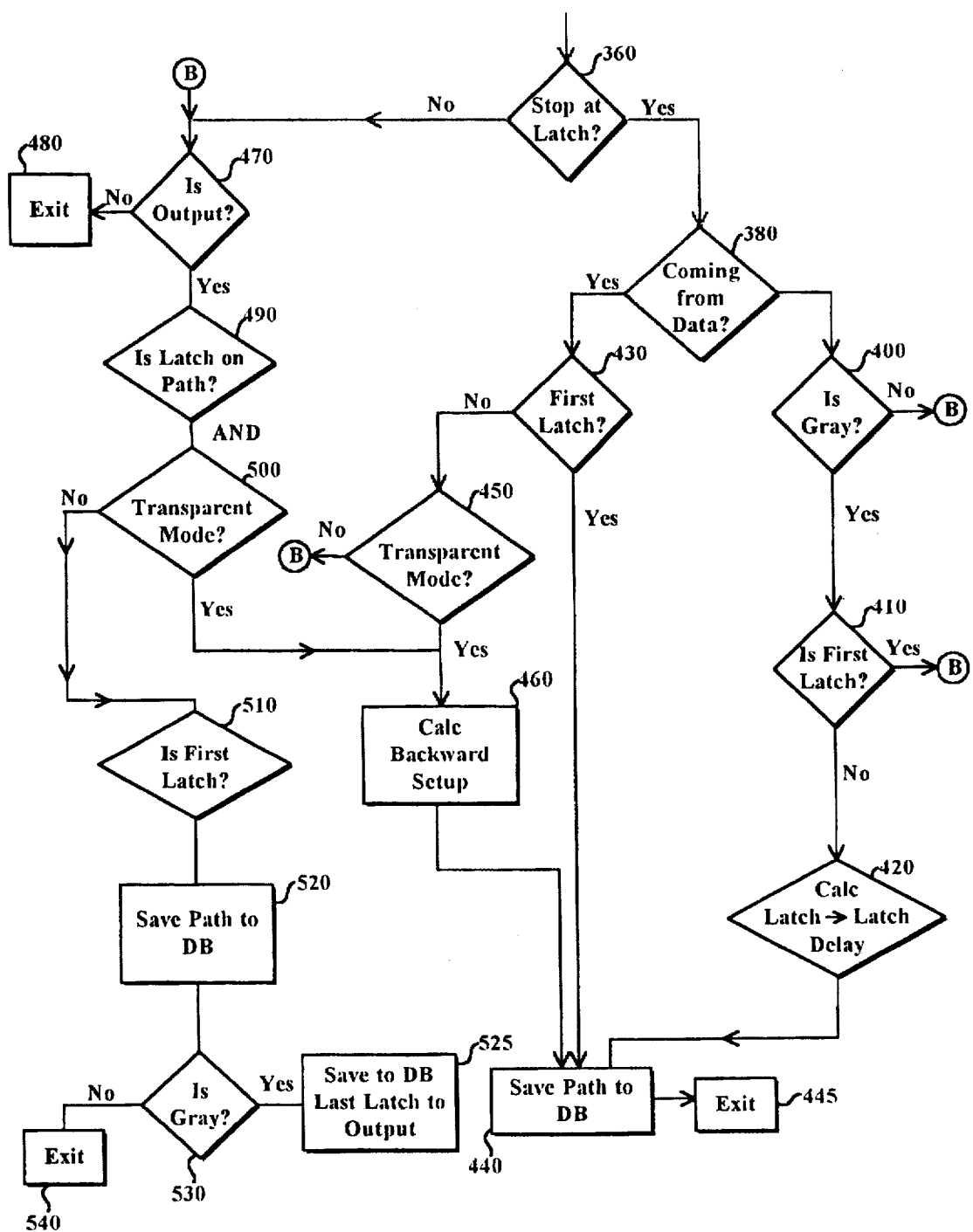

FIG. 34 illustrates more fully the saving of the timing model, step 80. When the instant arc leads to a latch, step 360, the present invention checks whether the arc comprises a data signal (as opposed to a clock signal), step 380. Where the path leads not from a data signal and where the current modeling mode is not grey (step 400) or the instant arc does not lead to a first latch (step 410), the present invention continues operation at step 480. However, where the arc does not lead from a data signal and leads to other than a first latch, the present invention calculates a latch-to-latch delay and saves the path information in the data structure of the gray model block at steps 420 and 440.

Where the arc come from a data path, from a first latch along the path, the present invention saves this path information in the data structure of the gray model. Where the arc is a data signal from a first latch, the present invention checks whether the user has enabled transparency, step 450. If so, the present invention calculates setup time in the backward manner described above and saves path information in the data structure of the gray model, steps 460 and 440. If not in transparent mode, the invention continues operation at step 470.

At step 470, the present invention checks where the instant arc leads to an output pin. If not, the saving of the timing model ends at step 480. If it does, and there is a latch somewhere in the path leading to this output pin and the user has enabled transparency, the present invention calculates setup time in the backward manner described above and saves path information in the data structure of the gray model, steps 460 and 440. If there is no latch in the path or if the user has asked for a transparent box and if the path is not crossing any latch from the data input (transparent) only from the clock, then the present invention saves the path, step 520. If the user has chosen to generate a gray box, then the present invention saves the timing arc between the last latch and the output (sink node) in the gray box data base, step 525.

Figure 35:
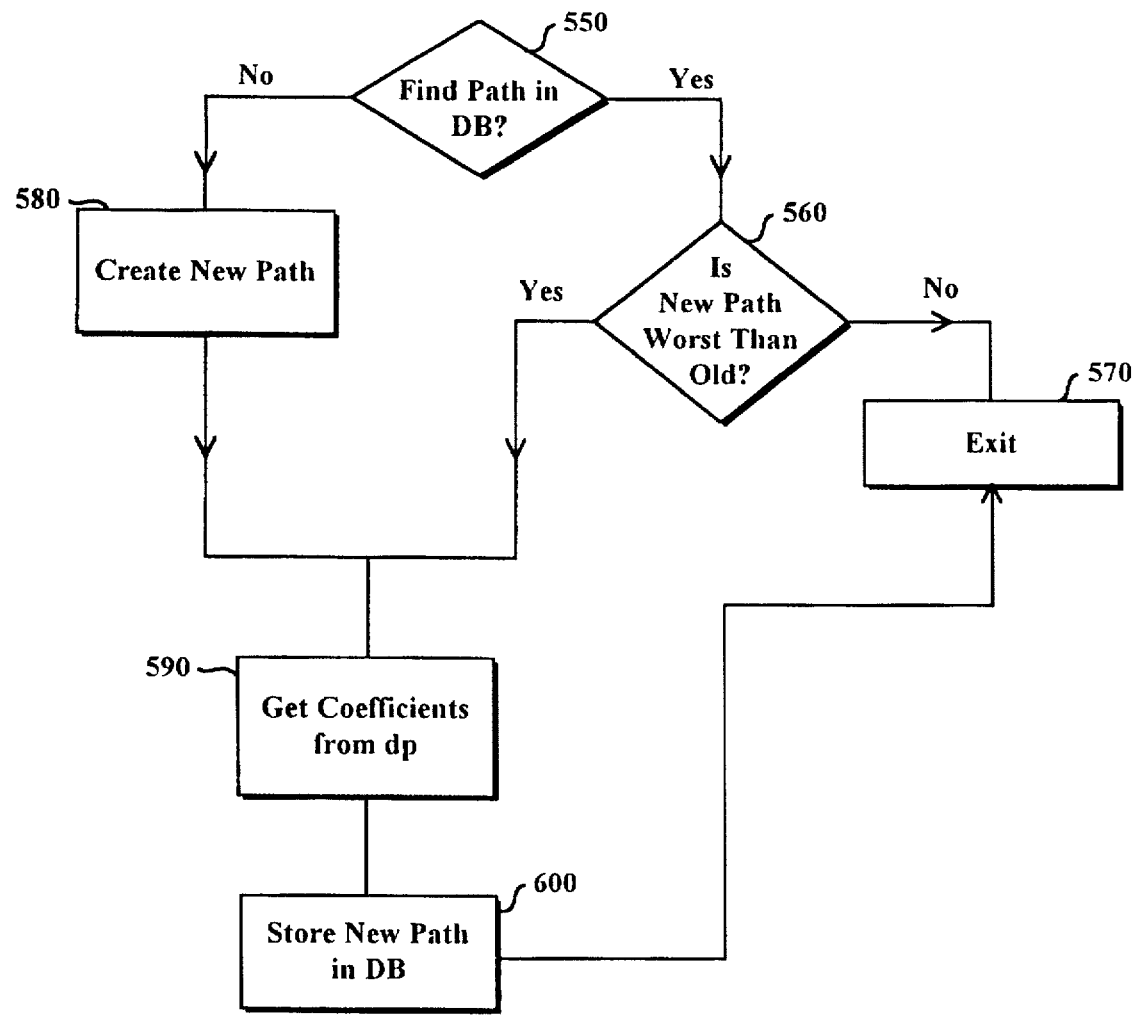
Figure 36:
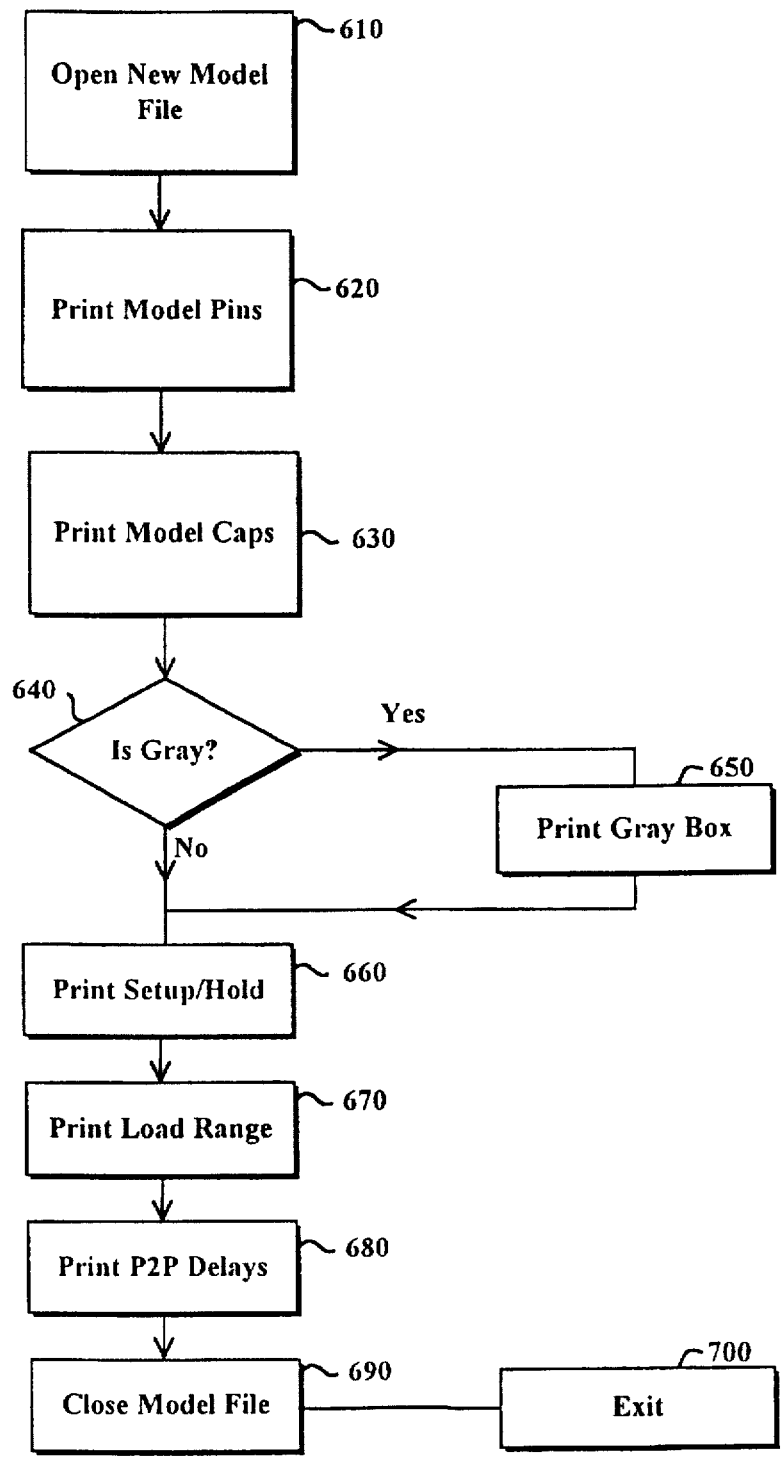
FIGS. 36 through 41 are flowcharts illustrating the printing of a model file from a data structure representing a gray box block model.

FIG. 35 illustrates more fully the saving of path information in the data structure of the gray box block model, step 440. The present invention first checks whether there is a worst path already in the database, step 550. If so, then the present invention checks whether the current path is worse than the path stored in the data base, step 560. If not, no information need be saved. If the current path is worse, then the present invention gets the coefficients from the data structure, associates them with the current path and stores the current path as the worst path, displacing the previously stored worst path, steps 590 and 600.

Of course, where there is no worse path already stored in the database, the present invention stores the current path as the worst path, steps 580, 590 and 600.

FIGS. 36 through 41 are flowcharts illustrating the printing of a model file from a data structure representing a gray box block model as described above. The present invention opens a file specified by the user, step 610, prints the model's pins, step 620, and prints the capacitance for the model, step 630. If the model is gray, the present invention print the gray box data at step 650. In any event, the invention continues to print the setup and hold times, the load ranges and the pin-to-pin delays, steps 660 through 680. The file is then closed, step 690.

Figure 37:
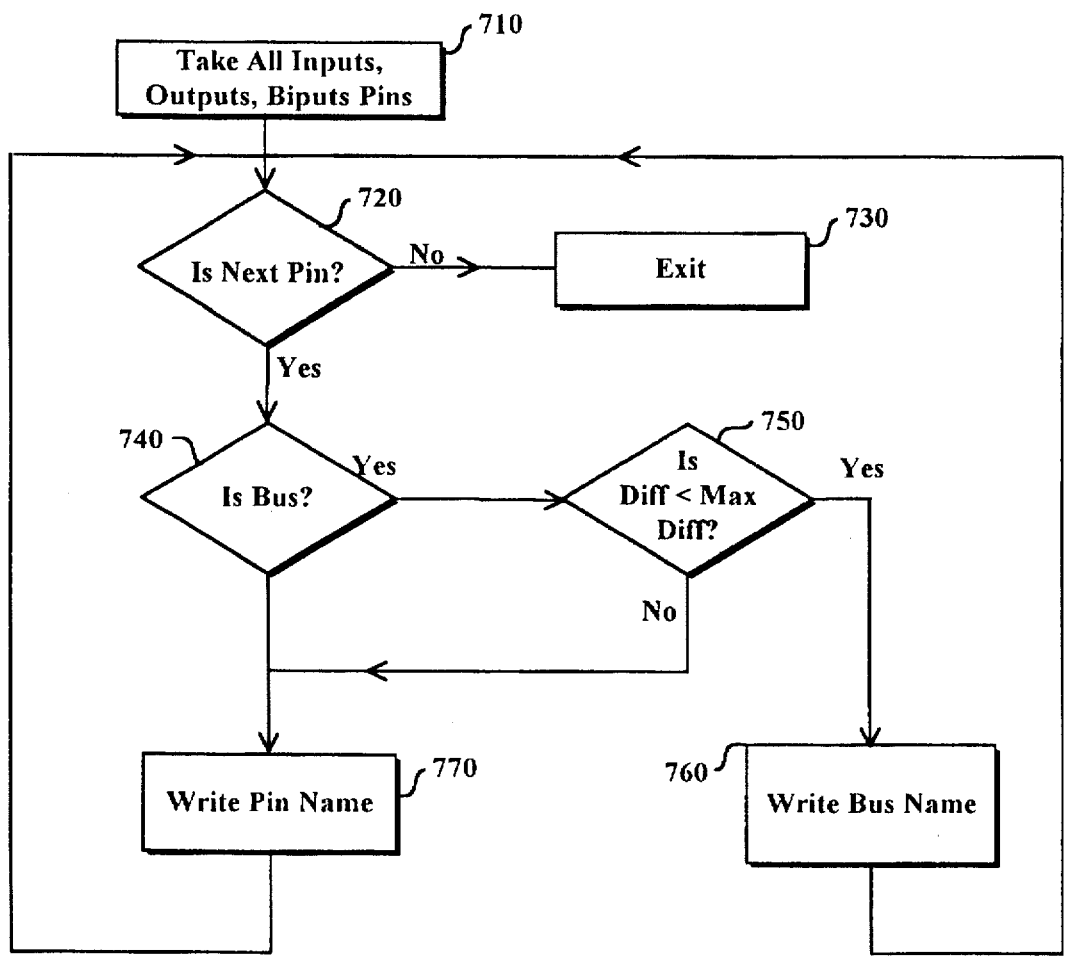

FIG. 37 illustrates more fully the printing of model pins, step 620. In the loop headed by steps 710 and 720, the present invention walks through each input, output and biput pin in the model data structure. For each pin, the present invention determines whether it is part of a bus, step 740. If the pin is part of a bus and the difference is less than the maximum difference, the present invention writes the bus name, steps 750 and 760. If the pin is not part of a bus or if the difference is not less than the maximum difference, the present invention simply writes the pin name, step 770.

Figure 38:
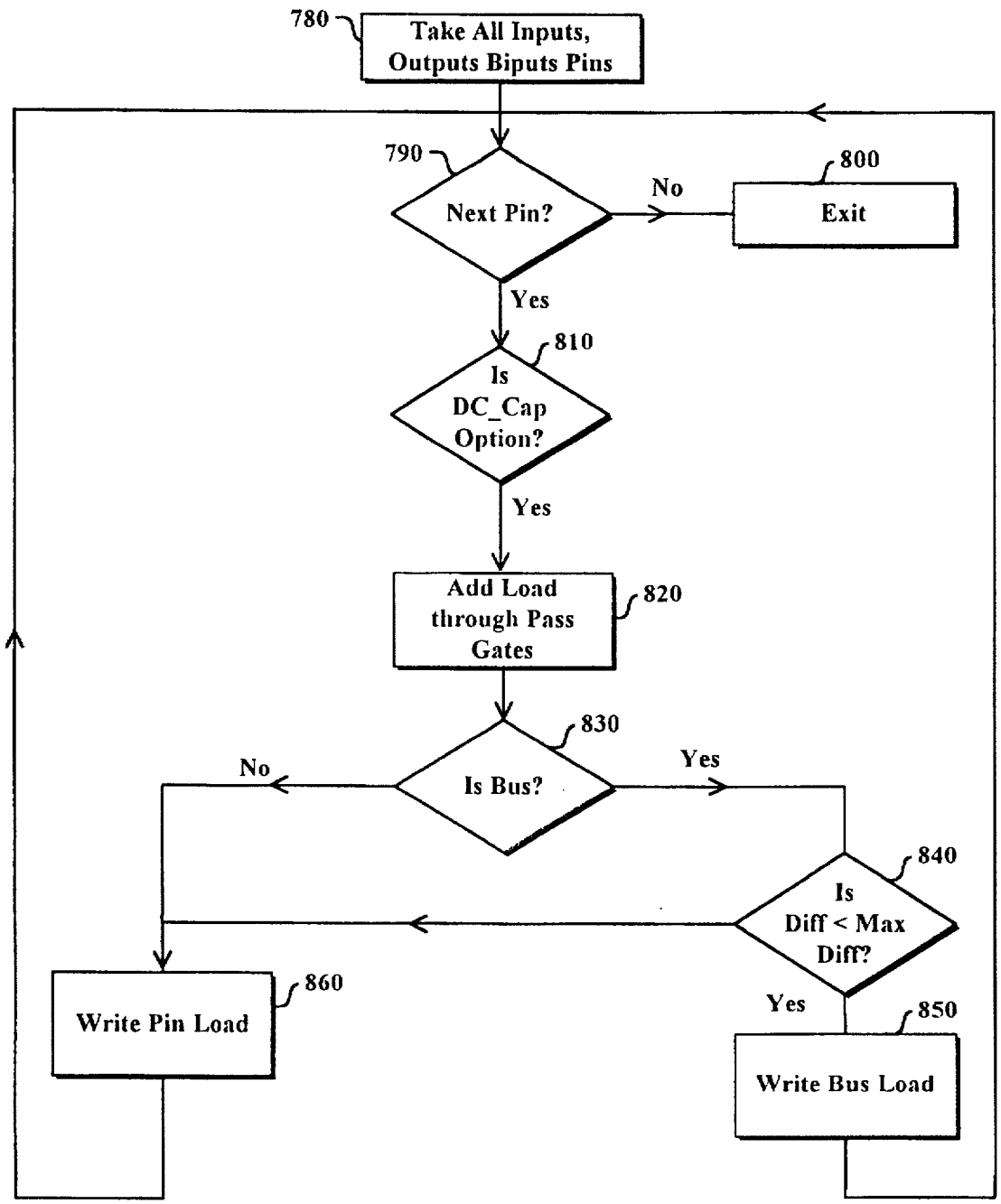

FIG. 38 illustrates more fully the printing of the model loads, step 630. In the loop headed by steps 780 and 790, the present invention walks through each input, output and biput pin in the model data structure. For each pin, the present invention accommodates dc capacitances and loads from pass-through gates, steps 810 and 820. If the pin is part of a bus, step 830, and the difference is less than the maximum difference, step 840, the present invention writes the bus load to an output file, step 850. Otherwise, the present invention writes the pin load to the output file, step 860.

Figure 39:
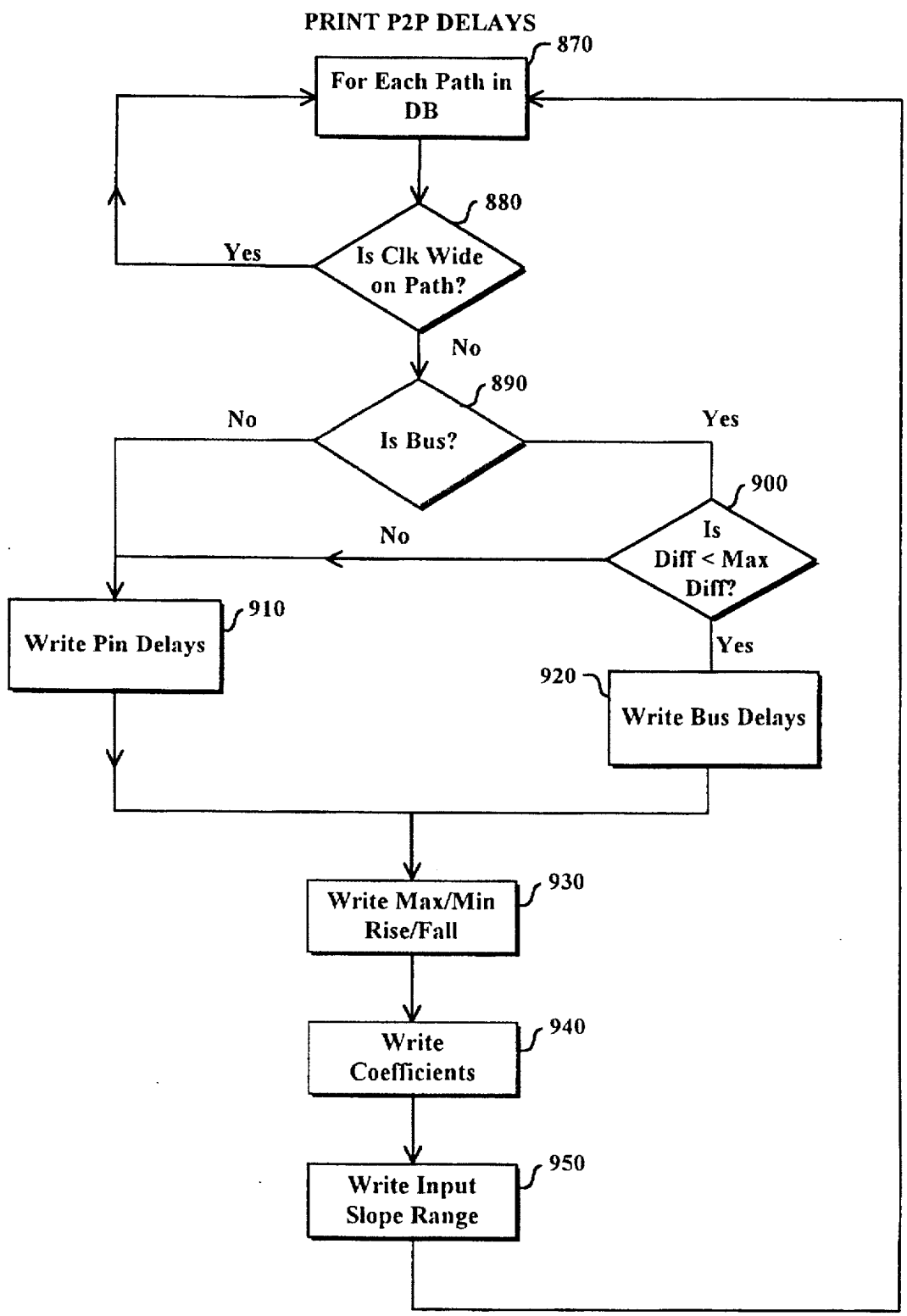

FIG. 39 illustrates more fully the printing of pin-to-pin delays, step 680. For each path stored in the data structure of the model, the present invention checks whether a clock node controls the path, steps 870 and 880. If so, the present invention moves on to the next path, if any. If a clock node does not control the path, if the current path encompasses a bus, step 890, and if the difference is less than the maximum difference, step 900, the bus delays are written. If the clock is not wide and either the current path does not encompass a bus or the difference condition is not satisfied, the present invention writes the pin delays, step 910. In any event, the present invention writes the rise and fall conditions, the coefficients and the input slope range, steps 930, 940 and 950.

Figure 40:
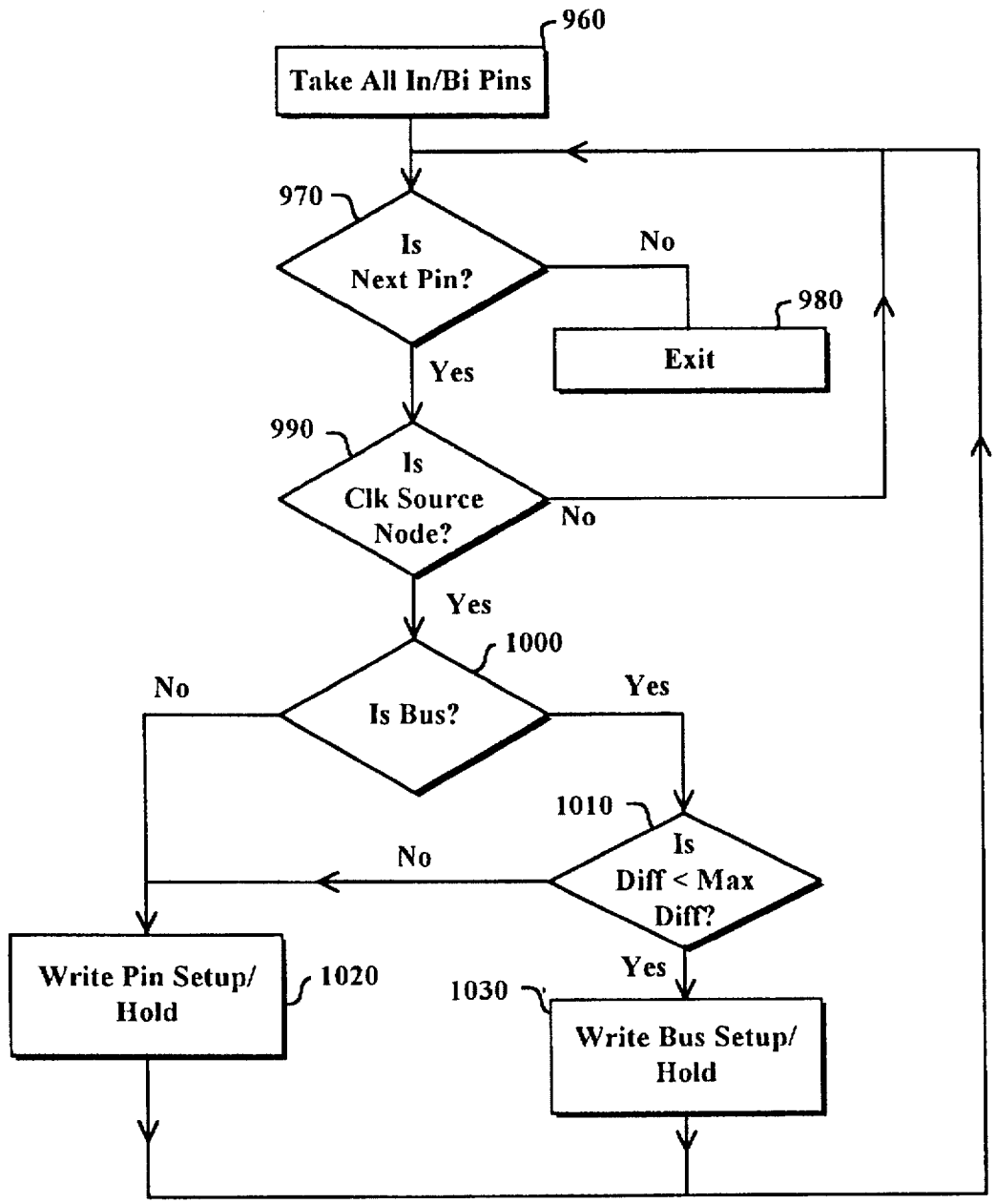

FIG. 40 illustrates more fully the printing of setup and hold times, step 660. At the loop headed by steps 960 and 970, the present invention walks through each input and biput pin. For each such pin which is not a clock source node, the present invention moves onto the next pin, step 990. With the clock source pins, the present invention checks whether each is part of a bus, step 1000, whether the difference is less than the maximum difference, step 1010, and prints bus setup and hold times if both conditions are true, step 1030. If either condition is not met, then the present invention writes the setup and hold times for the pin, step 1020.

Figure 41:
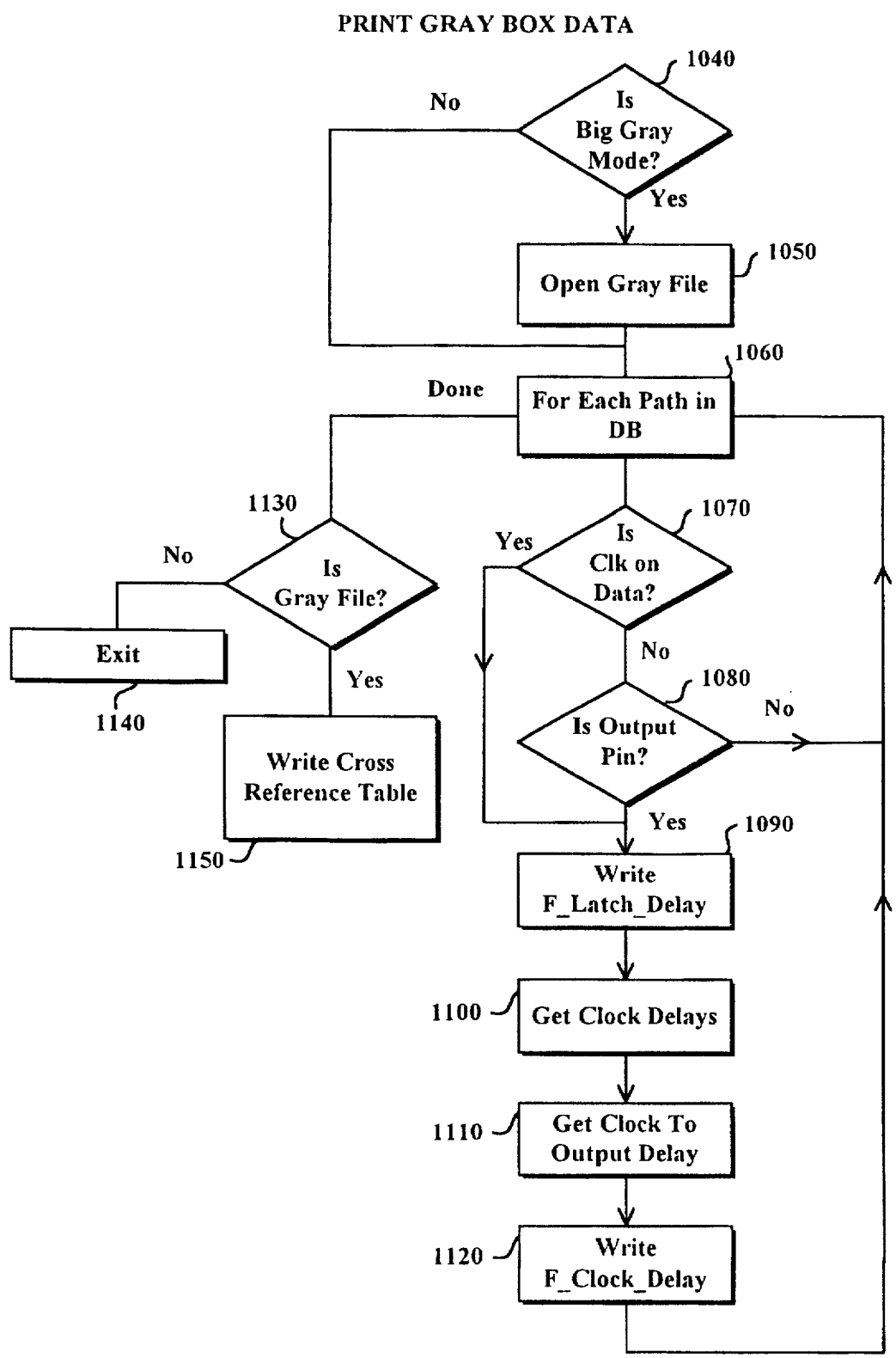

FIG. 41 illustrates more fully the printing of gray box model data, step 650. If there is a gray box data file, the invention accesses the information in that file, step 1050. While there are forced paths in the gray box data structures, the present invention checks whether there is a clock on the data or the current pin is an output pin, steps 1070 and 1080. If not, then the present invention moves on to the next forced path in the data structure, if any. For the clocked data or output pin, the present invention writes the latch delay and clock delays based on stored information, steps 1090 through 1120. Where there are no more forced paths and this model is a gray model, step 1130, the present invention exits at step 1140. Otherwise, it writes the cross reference table at step 1150.

Figure 42:
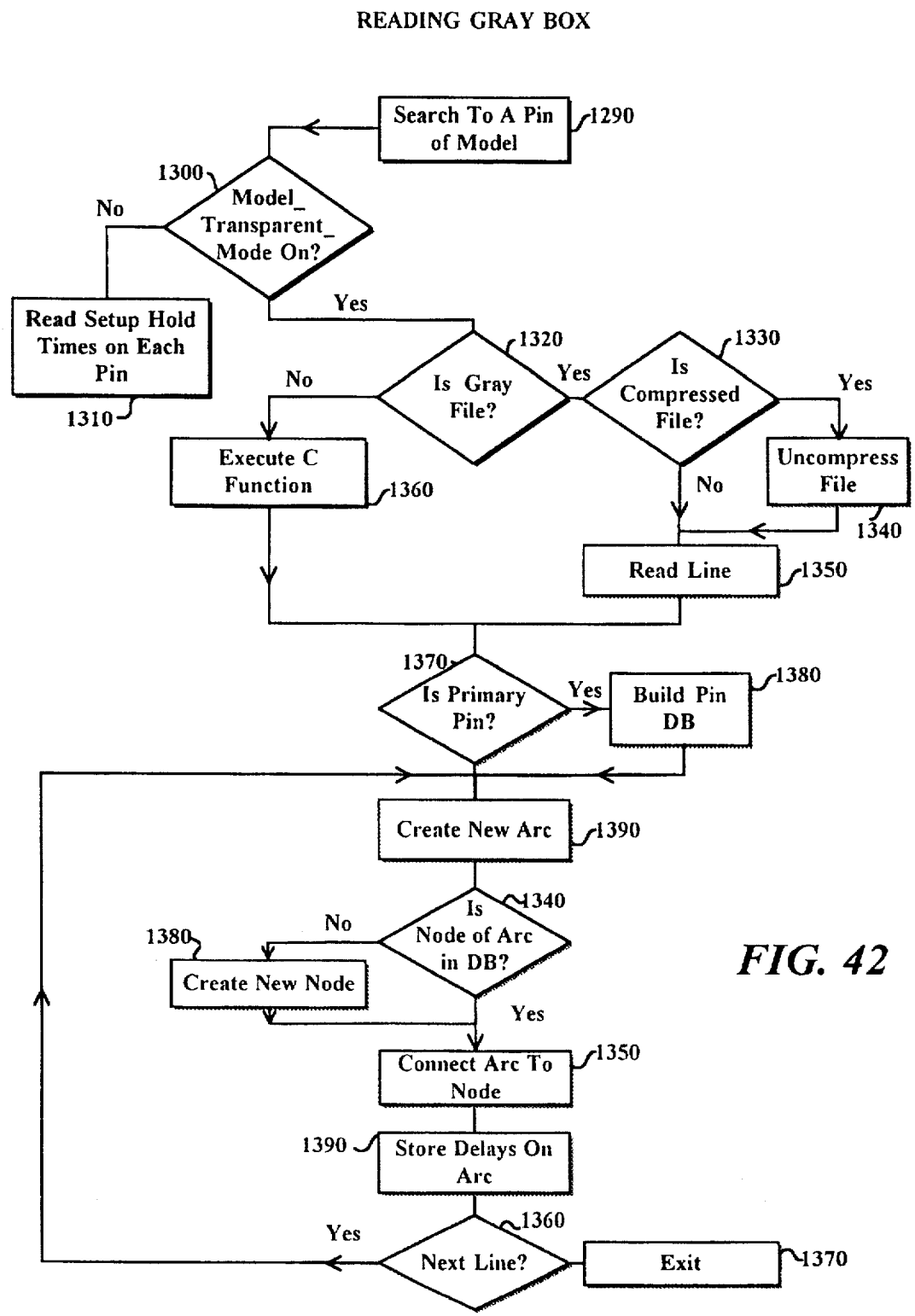
FIG. 42 is a flowchart illustrating the reading of a gray box block model data file.

FIG. 42 is a flowchart illustrating the reading of a gray box block model data file. The present invention searches to the declaration of a pin of the model at step 1290. If transparency is not enabled, step 1300, the present invention reads setup and hold times for each pin, step 1310. If transparency is enabled and this file is a gray box model file, step 1320, the present invention decompresses as necessary, steps 1330 and 1340, and reads the input, step 1350. If the current file is a C file, the present invention reads and executes the body of the model in order to read and analyze the timing information in the model, step 1360. In any event, if the current pin is a primary pin, step 1370, then the present invention creates a pin database for it. In any event, a new arc is created, step 1390, its nodes are entered into the database as necessary, steps 1340 and 1380, and the arc is connected to the node, step 1350. The present invention recognizes delays at step 1390 and then moves on to the next line of the file, if any, steps 1360 and 1370.

Figure 43:
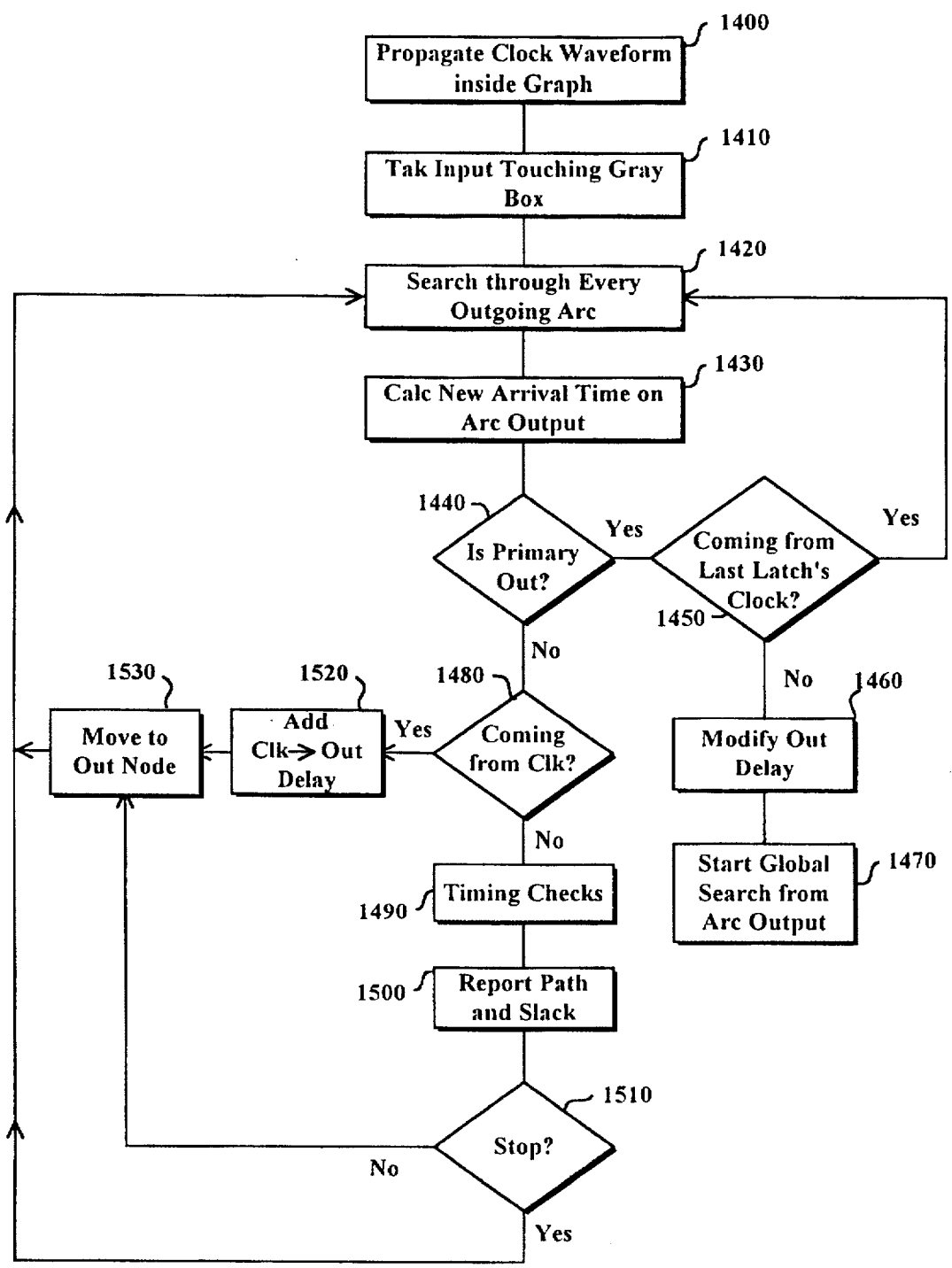
FIG. 43 is a flowchart illustrating the analysis of a gray box block model.
Figure 44:
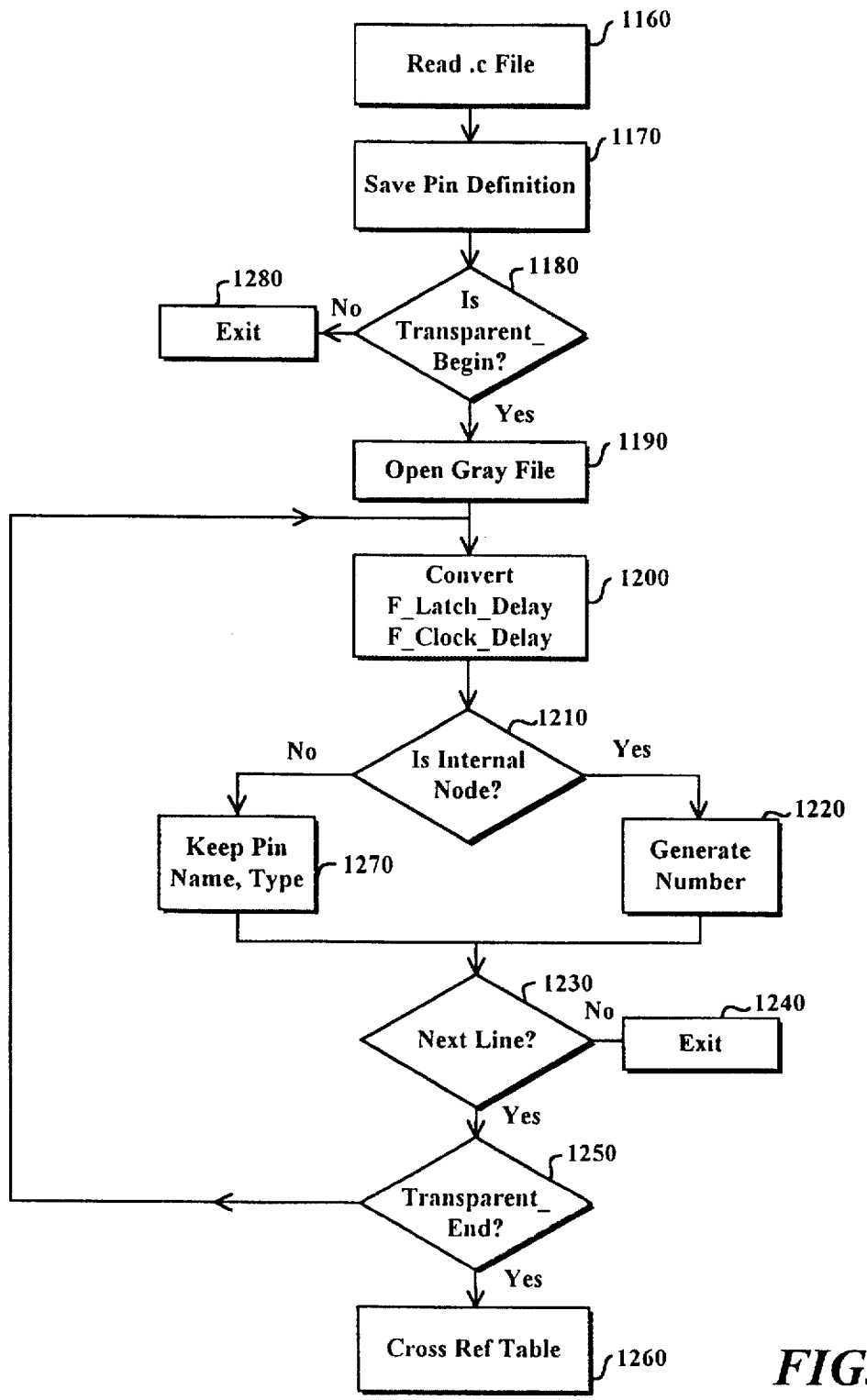
FIG. 44 is a flowchart illustrating the conversion of a C model file to an simpler text format file.

FIG. 43 is a flowchart illustrating the analysis of a gray box block model. At step 1400, the present invention propagates a clock waveform inside a graph. Once path searching generates a path to an input of the gray box model, step 1410, the present invention searches through every arc going out from that input, step 1420. Arrival times on the arc output are calculated at step 1430.

When a primary output is reached, step 1440, and the arc does not come from the last latch's clock, step 1450, the present invention modifies the output delay and starts global searching from the arc output, steps 1460 and 1470. Where the arc comes from the last latch's clock, the present invention moves on to the next arc coming out from the touched input pin.

Where the arc output is not a primary output, step 1440, and where the arc is not coming from a clock, step 1480, the present invention performs timing checks, step 1490, and reports path and slack, step 1500. If the present invention stops at this node (there is no transparency condition), the present invention moves on to the next arc coming out of the touched input pin, step 1510. Otherwise, the search continues forward, step 1530.

When the arc output is not a output primary pin and the arc comes from a clock, the clock delay is added to the delay of the output pin, step 1520, and this information is propagated to the output node of the internal latch, step 1530.

Hierarchical Gray Box Modeling

In a preferred embodiment, the user can build a gray box for a block which contains a gray box element. The present invention will maintain the lower-level gray box elements and will create a link to those elements in the higher-level gray box.

At the time of analysis, should the present invention come to a node which drives a lower-level gray box, the present invention will go down in the hierarchy of gray boxes to continue the timing verification.

High Delay Accuracy

In order to improve the accuracy of the determined delays, a gray box model can include actual devices such as transistors and RC elements on the boundary of the block. In special cases such as pass gates on the input of a gray box, special output drivers or feed-through resistances, such an improved model can be necessary to obtain practically useful determinations of delay.

What is claimed is:

1. A method for checking the timing of a circuit during static circuit analysis, said circuit including a stage having a pass transistor under the control of a clock, said method comprising:

searching paths in said circuit;

making said stage transparent; and performing timing checks on paths including said transparent stage.

2. The method of 1 wherein said stage has an input and an output, and said step of making a stage transparent comprises:

making said stage transparent when said clock controlling said stage is on when data arrives at said input of said stage, a clock triggering said data, said clock controlling said stage in the same or next phase from said clock triggering said data.

3. The method of claim 1 further comprising the step of reporting errors for said stage relative to the turn-off edge of said clock controlling said stage.

4. The method of claim 1 wherein said step of performing timing checks comprises checking absolute path delays against limits defined by a user; and said step of making said stage transparent comprises making said stage transparent only when a user indicates that transparent stages are to be checked for.

5. The method of claim 1 further comprising the step of producing a warning message when in one of said paths including said transparent stage said transparent stage is followed by other than a node terminating said one path or a stage having a pass transistor under the control of a clock.

6. The method of claim 1 wherein said step of making a stage transparent comprises making said stage transparent when a second stage having a pass transistor under the control of a second clock precedes said stage, said clock controlling said stage and said second clock controlling said second stage derived from the same edge of a reference clock; and said step of performing timing checks comprises performing all timing checks relative to global and local clocks with predefined waveforms.

7. A method for checking the timing of a circuit during static circuit analysis, said circuit having at least one primary input including at least one primary clock input, a plurality of sequential elements including first and last layers of sequential elements, and at least one primary output, said method comprising:

searching paths from said primary clock input and analyzing internal paths between or among said plurality of sequential elements, thereby determining worst and best paths between or among said plurality of sequential elements, the worst path between said primary input and said first layer of sequential elements and the worst path between said last layer of sequential elements and said primary output; and generating a first model of said circuit, said first model incorporating said determined best and worst paths information.

8. The method of claim 7 wherein said step of searching and analyzing further comprises determining the delay from said primary clock input to a clock pin of one of said plurality of sequential elements.

9. The method of claim 7 wherein said step of searching and analyzing comprises analyzing only paths which include a path between two of said plurality of sequential elements, which included path contains purely combinatorial gates.

10. The method of claim 7 further comprising the step of determining the setup and hold times for each of said at least one primary input and associating a second, black box model incorporating said setup and hold times with said first model.

11. The method of claim 10 further comprising the step of switching between said first model and said second, black box model for said circuit.

12. The method of claim 7 wherein said step of generating a first model comprises generating a model comprising representations of said primary input, said primary output and the functional behavior of said circuit.

13. The method of claim 7 further comprising the step of instantiating said first model in a second circuit.

14. The method of claim 12 wherein said circuit has state and said step of generating a first model further comprises incorporating a representation of state of said circuit in said model.

15. The method of claim 13 further comprising the step of analyzing said second circuit.

16. The method of claim 15 wherein said step of analyzing comprises processing said first model.

17. The method of claim 16 wherein said step of processing said gray box model comprises constructing a graph comprising a respective plurality of nodes representing said plurality of sequential elements and the connectivity among said plurality of elements, connecting said plurality of nodes by timing arcs representing the delays among said plurality of sequential elements, said primary input and said primary output.

18. The method of claim 16 wherein said step of processing said first model comprises propagating a clock waveform inside said gray box model.

19. The method of claim 18 wherein said step of propagating a clock waveform comprises propagating a clock waveform external to said first model from a primary clock input of said first model to one of said plurality of sequential elements of said first model.

20. The method of claim 7 wherein said first model has a bus input comprising a plurality of bits and said step of generating a first model comprises grouping a first subset of said plurality of bits as a single entity for processing.

21. The method of claim 20 wherein said step of generating a first model comprises grouping a first subset of said plurality of bits as a single entity for processing if the difference between or among the bits of said first subset is less than a predetermined amount.

22. The method of claim 20 wherein said step of generating a first model further comprises grouping a second subset of said plurality of bits as a single entity for processing, said subset and said second subset mutually exclusive.

23. The method of claim 22 wherein said step of generating a first model further comprises grouping a second subset of said plurality of bits as a single entity for processing, said subset and said second subset mutually exclusive, if the difference between or among the bits of said subset is less than a predetermined amount and the difference between or among the bits of said second subset is less than said predetermined amount.

24. A method for checking the timing of a circuit during static circuit analysis, said method comprising the steps of:

instantiating a gray box model in said circuit, said gray box model having a data input and an output;

searching along a path of said circuit up to said data input of said gray box model;

searching through said gray box model from said data input of said gray box model to said output of said gray box model; and continuing said path searching from said output of said gray box.

25. The method of claim 24 wherein after said step of searching through said gray box model is performed, the following step is performed:

reporting positive slack time or a timing error with respect to said search through said gray box model.

26. The method of claim 25 wherein after said step of searching through said gray box model is performed, the following step is performed:

recovering from a timing error by adjusting time and continuing said timing checking.

27. A method for checking the timing of a circuit during static circuit analysis, said circuit having first and second stages both capable of being transparent, said method comprising the steps of:

placing said first and second stages in series in said circuit; and searching along a path of said circuit, said path including said first and second stages, making said first stage transparent and refraining from making said second stage transparent.

* * * * *